US012517442B2

(12) United States Patent
Edinger et al.

(10) Patent No.: US 12,517,442 B2
(45) Date of Patent: *Jan. 6, 2026

(54) APPARATUS AND METHOD FOR REMOVING A SINGLE PARTICULATE FROM A SUBSTRATE

(71) Applicant: Carl Zeiss SMT GmbH, Oberkochen (DE)

(72) Inventors: Klaus Edinger, Lorsch (DE); Christian Felix Hermanns, Frankfurt am Main (DE); Tilo Sielaff, Darmstadt (DE); Jens Oster, Ober-Ramstadt (DE); Christof Baur, Darmstadt (DE); Maksym Kompaniiets, Weißenhorn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/529,068

(22) Filed: Dec. 5, 2023

(65) Prior Publication Data

US 2024/0295833 A1 Sep. 5, 2024

Related U.S. Application Data

(63) Continuation of application No. 17/369,900, filed on Jul. 7, 2021, now Pat. No. 11,886,126.

(30) Foreign Application Priority Data

Jul. 8, 2020 (DE) .................. 102020208568.4

(51) Int. Cl.
G03F 7/00 (2006.01)
G03F 1/84 (2012.01)
G06N 3/08 (2023.01)

(52) U.S. Cl.
CPC ........... *G03F 7/70925* (2013.01); *G03F 1/84* (2013.01); *G03F 7/70033* (2013.01); *G03F 7/7085* (2013.01); *G06N 3/08* (2013.01)

(58) Field of Classification Search
CPC ............. G03F 7/70925; G03F 7/70033; G03F 7/7085; G03F 1/82; G03F 7/0002;
(Continued)

(56) References Cited

U.S. PATENT DOCUMENTS 6,753,538 B2 6/2004 Musil et al.
6,812,460 B1 11/2004 Stallcup, II et al.
(Continued)

FOREIGN PATENT DOCUMENTS

CN 102918461 2/2013
CN 107203094 9/2017
(Continued)

OTHER PUBLICATIONS

Baur, C. et al, "Nanoparticle manipulation by mechanical pushing: underlying phenomena and real-time monitoring," *Nanotechnology*, vol. 9, pp. 360-364 (1998).
(Continued)

*Primary Examiner* — Christina A Riddle
(74) *Attorney, Agent, or Firm* — Fish & Richardson P.C.

(57) ABSTRACT

The present application relates to an apparatus and to a method for removing at least a single particulate from a substrate, especially an optical element for extreme ultraviolet (EUV) photolithography, wherein the apparatus comprises: (a) an analysis unit designed to determine at least one constituent of a material composition of the at least one single particulate; and (b) at least one gas injection system designed to provide a gas matched to the particular constituent in an environment of the at least one single particulate (Continued)

late; (c) wherein the matched gas contributes to removing the at least one single particulate from the substrate.

17 Claims, 16 Drawing Sheets

(58) Field of Classification Search
CPC ............... G03F 1/84; G03F 1/72; G03F 7/70483–70541; G03F 7/70616; G03F 7/7065; G03F 7/708; G03F 7/70858; G03F 7/70866; G03F 7/70908–7095; G03F 7/70975; G03F 7/70983; G03F 7/70991; G03F 1/22; G03F 1/24; G03F 1/68; G03F 1/74; G03F 1/80; G03F 1/86; G06N 3/08; G06N 20/00; G01N 23/203; G01N 23/2076; G01N 23/2258; G01N 23/2273; G01N 23/2276; G01N 21/94; G01N 21/95; G01N 21/9501; H05G 2/00–008
USPC ............... 430/5, 30; 355/30, 52–55, 67–77; 356/237.1–237.6; 250/306–443.1, 396 R, 250/397–399, 492.1–492.3, 493.1, 503.1, 250/504 R
See application file for complete search history.

(56) References Cited

U.S. PATENT DOCUMENTS

| | | | |
|---|---|---|---|
| 6,987,277 | B2 | 1/2006 | Baur et al. |
| 7,251,033 | B1 | 7/2007 | Phan et al. |
| 8,696,818 | B2 | 4/2014 | Robinson et al. |
| 11,886,126 | B2* | 1/2024 | Edinger ............... G03F 7/7085 |
| 2004/0099805 | A1* | 5/2004 | Ochiai ............... H01J 37/265 250/311 |
| 2006/0066824 | A1 | 3/2006 | Knappe et al. |
| 2007/0145297 | A1 | 6/2007 | Freriks et al. |
| 2007/0158304 | A1 | 7/2007 | Nasser-Ghodsi et al. |
| 2010/0186768 | A1 | 7/2010 | Kanimitsu |
| 2010/0288302 | A1 | 11/2010 | Ehm et al. |
| 2011/0279799 | A1* | 11/2011 | Singer ............... G03F 7/70925 355/53 |
| 2012/0100470 | A1 | 4/2012 | Nozawa et al. |
| 2012/0273458 | A1 | 11/2012 | Bret et al. |
| 2013/0070218 | A1 | 3/2013 | Ivanov et al. |
| 2014/0255831 | A1 | 9/2014 | Hofmann et al. |
| 2017/0189945 | A1 | 7/2017 | LeClaire et al. |
| 2017/0248842 | A1 | 8/2017 | Oster et al. |
| 2017/0292923 | A1 | 10/2017 | Baralia et al. |
| 2018/0261426 | A1 | 9/2018 | Kimura et al. |
| 2019/0252163 | A1 | 8/2019 | Gottscho |
| 2019/0354019 | A1 | 11/2019 | Freytag et al. |
| 2021/0048744 | A1 | 2/2021 | Baur et al. |
| 2022/0011682 | A1 | 1/2022 | Edinger et al. |

FOREIGN PATENT DOCUMENTS

| | | |
|---|---|---|
| CN | 112020672 | 12/2020 |
| DE | 102018200118 | 7/2018 |
| DE | 102018206278 | 10/2019 |
| DE | 102018221304 | 12/2019 |
| EP | 3 364 443 | 8/2018 |
| JP | 2004-151045 | 5/2004 |
| JP | 2004-537758 | 12/2004 |
| JP | 2005-084582 | 3/2005 |
| JP | 2005-159287 | 6/2005 |
| JP | 2010-170019 | 8/2010 |
| JP | 2011-504294 | 2/2011 |
| JP | 2014-519046 | 8/2014 |
| JP | 2014-174552 | 9/2014 |
| JP | 2017-201304 | 11/2017 |
| JP | 2018-116272 | 7/2018 |
| JP | 2018-152217 | 9/2018 |
| JP | 2018-152330 | 9/2018 |
| KR | 1020170115971 | 10/2017 |
| TW | I664312 | 7/2019 |
| TW | 201945840 | 12/2019 |
| WO | WO 2003/012551 | 2/2003 |

OTHER PUBLICATIONS

Beard, J. D. et al, "An atomic force microscope nanoscalpel for nanolithography and biological applications," *Nanotechnology*, vol. 20, 445302, pp. 1-10 (2009).

Cao, N. et al, "Interactive Micromanipulation of Picking and Placement of Nonconductive Microsphere in Scanning Electron Microscope," *Micromachines*, vol. 8, 257, doi: 10.3390 /mi8080257, pp. 1-13 (2017).

The First Office Action issued by the Chinese Patent Office for Application No. CN 202110772920.5, dated Oct. 11, 2023 (with English Translation).

The Notice of Grounds for Refusal issued by the Japanese Patent Office for Application No. JP 2021-113296, dated Sep. 22, 2022 (English Translation).

The Notice of Reasons for Rejection issued by the Korean Patent Office for Application No. KR 10-2021-0088984, dated Aug. 18, 2023 (English Translation).

English Translation of the Office Action and Search Report issued by the Taiwan Patent Office for Application No. TW 110125011, dated May 3, 2022.

Darwich, S. et al, "Manipulation of gold colloidal nanoparticles with atomic force microscopy in dynamic mode: influence of particle—substrate chemistry and morphology, and of operating conditions," *Beilstein Journal of Nanotechnology*, vol. 2, pp. 85-98 (2011).

Durston, P. J. et al, "Manipulation of passivated gold clusters on graphite with the scanning tunneling microscope," *Applied Physics Letters*, vol. 72, No. 2, pp. 176-178 (Jan. 12, 1998).

Gallagher, E. et al, "EUVL mask repair: expanding options with nanomachining," *BACUS*, vol. 29, Issue 3, pp. 1-10 (Mar. 2013).

J. Xu et al.: "Lifting and Sorting of Charged Au Nanoparticles by Electrostatic Forces in Atomic Force Microscopy," Small, vol. 6, No. 19, pp. 2105-2108 (2010).

Martin, M. et al, "Manipulation of Ag nanoparticles utilizing noncontact atomic force microscopy," *Applied Physics Letters*, vol. 73, No. 11, pp. 1505-1507 (Sep. 14, 1998).

Pieper, H.H. et al.: "Morphology and nanostructure of $CeO_2(111)$ surfaces of single crystals and Si(111) supported ceria films," Physical Chemistry Chemical Physics, vol. 14, p. 52-100 (2012).

Pieper, H.H., "Morphology and electric potential of pristine and gold covered surfaces with fluorite structure," *Thesis, University of Osnabrück*, (2012).

Requicha, "Nanomanipulation with the Atomic Force Microscope," *Nanotechnology Online*, ISBN: 9783527628155 (Jul. 15, 2010).

Shimomura, T. et al., "50 nm particle removal from EUV mask blank using standard wet clean", *Proc. of SPIE*, vol. 7488, pp. 74882F-1-74882F-8 (2009).

Versolato, O., "Physics of laser-driven tin plasma sources of EUV radiation for nanolithography," *Plasma Sources Science and Technology*, vol. 28, pp. 1-16 (2019).

Xu, Z. W. et al, "Carbon Nanotube AFM Probe Technology," *Electronic Properties of Carbon Nanotubes*, Published by InTech, pp. 105-124 (Jul. 2011).

The Notice of Allowance issued by the Chinese Patent Office for Application No. CN 202110772920.5 dated Apr. 25, 2024 (with English Translation).

The Office Action issued by the Japanese Patent Office for Application No. JP 2023-149911, dated Jul. 1, 2024 (English Translation Only).

The Office Action issued by the Taiwan Patent Office for Application No. TW 113107295 dated Oct. 28, 2024 (English Translation Only).

(56) References Cited

OTHER PUBLICATIONS

The Office Action issued by the German Patent Office for Application No. DE 10 2020 208 568.4, dated Mar. 14, 2025 (with English Machine Translation).

* cited by examiner

APPARATUS AND METHOD FOR REMOVING A SINGLE PARTICULATE FROM A SUBSTRATE

CROSS-REFERENCE TO RELATED APPLICATION

This application is a continuation of and claims priority under 35 U.S.C. § 120 to U.S. application Ser. No. 17/369,900, filed on Jul. 7, 2021, which claims priority from German Application No. 10 2020 208 568.4, filed on Jul. 8, 2020. The contents of the above priority applications are incorporated herein by reference in their entirety.

TECHNICAL FIELD

The present invention relates to an apparatus and to a method for removing at least a single particulate from a substrate, especially from an optical element which is used in a photolithography system, for example a system for the extreme ultraviolet (EUV) wavelength range.

BACKGROUND

As a consequence of the steady increase in integration density in microelectronics, photolithographic masks have to image structure elements that are becoming ever smaller into a photoresist layer of a wafer. This is likewise true of templates that are used in nanoimprint lithography. In order to meet these requirements, the exposure wavelength is being shifted to ever shorter wavelengths. At the present time, argon fluoride (ArF) excimer lasers are principally used for exposure purposes, these lasers emitting at a wavelength of 193 nm. Intensive work is being done in regard to light sources which emit in the EUV wavelength range (10 nm to 15 nm), and corresponding EUV masks. In order to increase the resolution capability of wafer exposure processes, a number of variants of the conventional binary photolithographic masks have been developed simultaneously. Examples thereof are phase masks or phase-shifting masks and masks for multiple exposure.

On account of the ever decreasing dimensions of the structure elements, photolithographic masks, photomasks or simply masks cannot always be produced without defects that are printable or visible on a wafer. Because the production of photolithographic masks is costly, defective photomasks are repaired whenever possible, as are the templates used in nanoimprint lithography.

Repairing photomasks involves removing parts of an absorber pattern which are present at mask locations not envisaged in the design. Furthermore, absorbing material is deposited at locations on the mask which are free of absorbing material even though the mask design provides absorbing pattern elements. Both types of repair processes can produce debris fragments or particulates which can settle on transparent or reflective locations of photomasks and which can be visible as imaging aberrations on a wafer.

What are more important, however, are soil particles from the environment that are deposited on the surface of a mask or more generally on optical elements or components of a photolithographic exposure system. These are removed as standard from the surface of the masks by cleaning steps during mask production and/or during operation of the masks or the optical elements. FIG. 1 shows a top view of a section of a photomask having a particulate which is disposed on a pattern element of the mask and can be removed by use of a cleaning operation. Moreover, particulates that can settle on the mask can be produced by the handling of a mask during the production process and/or the operation thereof.

There are two further difficulties in the case of photolithographic exposure systems that work with electromagnetic radiation in the EUV wavelength range. For EUV masks, there is currently no protection (for instance a pellicle) for the surface thereof that bears the structure elements. As a result, EUV masks are particularly prone to the settling of particulates on this structured surface. Secondly, an EUV radiation source typically uses a tin plasma to generate the EUV radiation (cf. Oscar O. Versolato: "Physics of laser-driven tin plasma sources of EUV radiation for nanolithography," Plasma Sources Sci. Technol. 28 (2019) 083001, doi: 10/1088/1361-6595/ab302). Particulates from the hot plasma can be deposited on components of an EUV exposure system, especially on the optical components or elements thereof, including the EUV mask, and can impair the function thereof.

The ever decreasing structure measurements of photolithographic masks are making cleaning operations increasingly difficult (cf. T. Shimomura and T. Liang: "50 nm particle removal from EUV mask blank using standard wet clean," Proc. of SPIE Vol. 7488, pp. 74882F-1-74882F-8). Moreover, as a result of the decreasing exposure wavelength, ever smaller foreign or dirt particles adsorbed on the surface of the mask or of an optical element of the exposure system are becoming visible during an exposure process on a wafer. FIG. 2 shows a schematic of a section of a mask in which two particulates that are localized in a contact hole of the photomask cannot be removed from the mask with the aid of a cleaning operation.

Some documents that examine the movement of nanoparticles with the aid of a nano- or micromanipulator are cited below by way of example: H. H. Pieper: "Morphology and electric potential of pristine and gold covered surfaces with fluorite structure," Thesis, University of Osnabrück 2012; S. Darwich et al.: "Manipulation of gold colloidal nanoparticles with atomic force microscopy in dynamic mode: influence of particle-substrate chemistry and morphology, and operating conditions," Beilstein J. Nanotechnol., vol. 2 (2011), pp. 85-98; H. H. Pieper et al.: "Morphology and nanostructure of CeO2(111) surfaces of single crystals and Si(111) supported ceria films," Phys. Chemistry Chemical Physics, vol. 14, p. 15361ff, 2013; E. Gallagher et al.: "EUVL mask repair: expanding options with nanomachining," BACUS, vol. 3, no. 3 (2013), pp. 1-8; M. Martin et al.: "Manipulation of Ag nanoparticles utilizing noncontact atomic force microscopy," Appl. Phys. Lett., vol. 72, no. 11, September 1998, pp. 1505-1507; P. J. Durston et al.: "Manipulation of passivated gold clusters on graphite with the scanning tunneling microscope," Appl. Phys. Lett., vol. 72, no. 2, January 1998, pp. 176-178; R. Requicha: "Nanomanipulation with the atomic force microscope," Nanotechnology Online, ISBN: 9783527628155; C. Baur et al.: "Nanoparticle manipulation by mechanical pushing: underlying phenomena and real-time monitoring," Nanotechnology 9 (1998), pp. 360-364; J. D. Beard et al.: "An atomic force microscope nanoscalpel for nanolithography and biological applications," Nanotechnology 20 (2009), 445302, pp. 1-10; U.S. Pat. No. 6,812,460 B1. The following documents report the lifting and placement of particulates on substrates: J. Xu et al.: "Lifting and sorting of charged Au nanoparticles by electrostatic forces in atomic force microscopy," Small 2010, vol. 6, no. 19, pp. 2105-2108; N. Cao et al.: "Interactive micromanipulation of picking and placement of nonconductive microsphere in scanning electron microscope," Micromachines 2017, 8, 257, doi: 10.3390/mi8080257; U.S. Pat. No. 8,696,818 B2; JP 2005-084582; and U.S. Pat. No. 6,987,277 B2.

The movement of particulates and especially the lifting of individual particulates from a surface is typically a complex and time-consuming process. Moreover, it can be difficult to completely remove a particulate adhering to a surface of an optical element from the optical element.

The problem addressed by the present invention is therefore that of specifying an apparatus and a method that enable to improve the removal of particulates from a substrate, especially from an optical element for photolithography.

SUMMARY

In accordance with one exemplary embodiment of the present invention, this problem is solved by a method according to Claim 1. In one embodiment, the apparatus for removing at least a single particulate from a substrate, especially an optical element for extreme ultraviolet (EUV) photolithography, comprises: (a) an analysis unit designed to determine at least one constituent of a material composition of the at least one single particulate; and (b) at least one gas injection system designed to provide a gas matched to the particular constituent in an environment of the at least one single particulate; (c) wherein the matched gas contributes to removing the at least one single particulate from the substrate.

One frequent reason why it is difficult to execute a local etching operation is that the material composition of the particulate to be removed is generally unknown. Therefore, a local etching and/or deposition operation can be matched only partly, or very often not at all, to the particulate to be removed. Therefore, the local etching operation is often time-consuming and fairly frequently without success.

Because the material composition of a particulate adsorbed on a surface is at least partly determined before any processing operation, a processing operation, for example an etching operation or a depositing operation, can be matched to a specific particulate. A processing operation matched to the particulate enables largely residue-free removal of the particulate without significantly damaging the substrate surrounding the particulate during the processing operation.

The analysis unit can make use of at least one element from the group of the following techniques: energy-dispersive x-ray spectroscopy (EDX), x-ray photoemission spectroscopy (XPS), Auger electron spectroscopy (AES), secondary ion mass spectrometry (SIMS), secondary neutral mass spectrometry (SNMS), Rutherford backscattering spectrometry (RBS) and low-energy ion scattering spectroscopy (LEIS).

The analysis unit can be designed to take account of an external input in determining the at least one constituent of the material composition.

An external input can come from a technical expert making use of an apparatus of the invention. An external input can alternatively, for example, also be provided by an external material database.

The analysis unit can also be designed to take account of a material composition of the substrate in determining the matched gas. The analysis unit can additionally be designed to determine an exposure dose of the matched gas for removal of the at least one single particulate. Moreover, the analysis unit can be designed to take account of the substrate surrounding the particulate to be removed in determining the exposure dose.

The apparatus can include a material database and/or have an interface that enables access to a material database. The material database can contain data of possible materials of the at least one single particulate.

The apparatus can also include a machine learning model trained to use measurement data from the analysis unit to predict the at least one constituent of the material composition of the at least one single particulate. Moreover, the apparatus can include a predictive filter designed to use measurement data from the analysis unit to predict the at least one constituent of the material composition of the at least one single particulate.

On the basis of measurement data from the analysis unit, the ML model and/or the predictive filter can predict one or more constituents of the material composition. This enables the execution of a largely automated processing operation matched specifically to an identified particulate. In addition, the uncertainty of the determination of the material composition of a particulate can be estimated as well. In this way, it is possible to select the best possible processing operation for a particulate.

The trained machine learning model can comprise a recurrent neural network (RNN). The recurrent neural network can comprise a long short-term memory (LSTM) network.

The training data from the ML model can be the measurement data for the material compositions of known particulates that can occur on optical elements for photolithography. In addition, the training data for the machine learning model can additionally comprise the measurement data for specific synthesized material compositions. Moreover, it is possible to train the ML model with data collected by an operator of a repair tool during operation.

The predictive filter can comprise an element from the group: a Kalman filter, a particulate filter and a low-pass filter with a finite impulse response.

The apparatus can further comprise: at least one microscopy system designed to image the at least one single particulate, preferably during the removal of the at least one single particulate.

The microscopy system can be used to identify a particulate on a substrate. In addition, the microscopy system can be used to monitor and/or to control the processing operation on a particulate.

The microscopy system can be designed to determine a parameter of the at least one single particulate.

The microscopy system can use particles of zero mass for imaging of the at least one single particulate. The microscopy system can use photons from the extreme ultraviolet wavelength range for imaging of the at least one single particulate. The microscopy system can use particles of non-zero mass for imaging of the at least one single particulate. The microscopy system can use charged particles for imaging of the at least one single particulate, especially electrons and/or ions. The microscopy system can use electrically uncharged particles of non-zero mass for imaging of the at least one single particulate, especially atoms and/or molecules.

The substrate can comprise a photolithographic mask, a template for nanoimprint lithography and/or an optical element of a photolithographic exposure apparatus. The photolithographic mask can be any type of photomask, for example a binary mask or a phase-shifting mask. More particularly, the photolithographic mask can comprise a mask for the deep ultraviolet (DUV) or extreme ultraviolet (EUV) wavelength range.

The at least one single particulate may have any desired shape. The at least one single particulate may have a diameter within a range from about 1 nm to about 100 μm. The at least one single particulate may interact with the substrate in any desired manner.

The apparatus can also include a control unit designed to monitor a gas composition of the matched gas. In addition, the control unit can be designed to control a gas flow rate of the matched gas. In this way, the control unit can monitor the provision of a particular exposure dose in the vicinity of a particulate to be removed.

The matched gas can spontaneously etch the at least one single particulate.

In one working example, the gas injection system provides, in an environment of a particulate to be removed, a gas matched to the particulate identified that etches the particulate spontaneously, i.e. without further supply of external energy.

The matched gas can spontaneously etch the at least one single particulate at a rate higher than the spontaneous etch rate of the substrate at least by a factor of 2, preferably at least by a factor of 5, more preferably at least by a factor of 10, and most preferably at least by a factor of 30.

In the case of a processing operation on a particulate executed in the form of an etching operation, it is favorable when the etching operation attacks the substrate surrounding the particulate as little as possible. It is therefore advantageous when the analysis unit takes account of the composition of the substrate in the environment of the particulate to be removed in determining a matched gas.

The matched gas can comprise an etch rate for at least one element from the group of: ruthenium (Ru), tantalum nitride (TaN), silicon dioxide ($SiO_2$) and $Mo_xSiO_yN_z$, where $0 \leq x \leq 0.5$, $0 \leq y \leq 2$ and $0 \leq z \leq 4/3$, which is smaller than the etch rate of the at least one single particulate at least by a factor of 2, preferably at least by a factor of 5, more preferably at least by a factor of 10, and most preferably at least by a factor of 30.

The at least one single particulate can comprise silicon (Si), and the matched gas can comprise at least one halogen, especially a halogen compound, for instance xenon difluoride ($XeF_2$). The at least one single particulate can comprise one or more organic compounds, and the matched gas can comprise water vapor ($H_2O$). The at least one single particulate can comprise tin (Sn), and the matched gas can comprise at least hydrogen ($H_2$), at least one hydrogen compound and/or at least nitrosyl chloride (NOCl).

It is possible to use the water vapor and/or nitrosyl chloride etch gases in order to spontaneously etch a particulate having tin as its main constituent.

An apparatus according to the invention can further comprise: at least one particle beam that initiates a local etching reaction of a first matched gas that etches the at least one single particulate and/or initiates a local deposition reaction of a second matched gas that deposits material on the at least one single particulate.

In another embodiment, a particle beam in the apparatus can execute, for example, an electron beam-induced etching (EBIE) operation and/or an electron beam-induced deposition (EBID) operation.

The at least one single particulate can comprise tin and the at least one first matched gas can comprise at least one element from the group of: a hydrogen compound, hydrogen ($H_2$), a halogen compound, a chlorine compound, and nitrosyl chloride (NOCl).

A particulate comprising tin can also be removed from a substrate by use of a particle beam-induced etching operation, wherein the etching gas selected is at least one element from the list above.

The particle beam of the microscopy system can be identical to the particle beam of the apparatus and a particle beam of the analysis unit. It is alternatively possible that the microscopy system, the apparatus and the analysis unit each use a dedicated particle beam. In addition, two of the three devices or units can make use of a common particle beam.

The analysis device can be designed to determine a matched gas that deposits a locally limited protective layer on the substrate in an environment of the at least one single particulate prior to processing of the at least one single particulate.

The gas injection system can also be designed to deposit the locally limited protective layer around the at least one single particulate.

The analysis unit can select the matched gas for deposition of the locally limited protective layer from the group comprising: metal carbonyls, transition element carbonyls, main group element carbonyls, metal alkoxides, transition element alkoxides, main group element alkoxides, and unsaturated aromatic hydrocarbons.

Metal carbonyls, transition element carbonyls or main group element carbonyls can comprise: chromium hexacarbonyl ($Cr(CO)_6$), molybdenum hexacarbonyl ($Mo(CO)_6$), tungsten hexacarbonyl ($W(CO)_6$), dicobalt octacarbonyl ($Co_2(CO)_8$), triruthenium dodecacarbonyl ($Ru_3(CO)_{12}$), and iron pentacarbonyl ($Fe(CO)_5$).

Metal alkoxides, transition element alkoxides or main group element alkoxides can comprise: tetraethyl orthosilicate (TEOS, $Si(OC_2H_5)_4$) and titanium isopropoxide ($Ti(OCH(CH_3)_2)_4$).

The unsaturated aromatic hydrocarbons can comprise styrene.

The gas injection system can be designed to intermittently provide the gas flow rate of the matched gas, such that the at least one particle beam can be used intermittently for processing and for imaging of the at least one single particulate. The at least one particle beam can comprise at least one electron beam.

The at least one single particulate can comprise molybdenum (Mo), and the matched gas can comprise xenon difluoride ($XeF_2$). The at least one single particulate can comprise silicon (Si) and/or ruthenium (Ru); the matched gas can comprise $XeF_2$ and water vapor ($H_2O$). The at least one single particulate can comprise one or more organic materials and water, and the matched gas can comprise $XeF_2$.

The at least one single particulate can comprise tin (Sn), and the matched gas can comprise at least hydrogen ($H_2$) and/or at least one hydrogen compound. The at least one hydrogen compound can comprise at least one element from the group of: ammonia ($NH_3$), ammonium carbamate ($H_2NCOONH_4$) and ammonium carbonate (($NH_4)_2CO_3$).

A hydrogen compound can be used in order to remove a tin particulate from a substrate with the aid of a local particle beam-induced etching operation.

The apparatus can also include at least one micromanipulator unit designed to interact with the at least one single particulate.

As set out above, a particulate present on a substrate can be removed with the aid of a spontaneous or locally induced etching operation. It is alternatively possible to remove a particulate from the substrate by movement.

The microscopy system can be designed to image the at least one single particulate while it is interacting with the at least one micromanipulator unit. The at least one micromanipulator unit can be designed to interact with the at least one single particulate via at least one of the following forces: van der Waals force, electrostatic force and chemical bonding force.

It is an advantage of the apparatus described in this application that the particulate can be imaged while it is being processed by the micromanipulator unit. This firstly facilitates the execution of a difficult processing operation, and secondly largely prevents damage to the substrate by the micromanipulator unit during the processing operation.

The at least one micromanipulator unit can comprise at least one L-shaped micromanipulator, or one in the form of a set of tongs.

The apparatus can further include a movement device designed to move the micromanipulator unit relative to the at least one single particulate.

The at least one micromanipulator unit can be designed to execute at least one element from the group of: moving the at least one single particulate on the substrate, comminuting the at least one single particulate on the substrate, and taking up the at least one single particulate from the substrate.

The at least one micromanipulator unit can comprise at least two micromanipulators designed to fix the at least one single particulate.

The at least one particle beam can be designed to induce an electrostatic charge of the at least one single particulate. The apparatus can further include an ion gun (flood gun) designed to induce an electrostatic charge of the at least one single particulate.

The movement device can be designed to position the at least one micromanipulator unit close to the at least one single particulate before removal and/or processing of the at least one single particulate, such that the micromanipulator unit protects the substrate surrounding the at least one single particulate at least partly from any effect of the processing of the at least one single particulate.

By skillful positioning of one or more micromanipulators of a micromanipulator unit close to a single particulate to be removed, it is possible to at least partly prevent the processing operation from also affecting the substrate surrounding the particulate. By appropriate positioning of the micromanipulator unit, it is possible, for example, to prevent placement of a locally limited protective layer around the particulate to be removed before the execution of the processing operation.

The at least one micromanipulator unit can comprise at least one micromanipulator, and the at least one micromanipulator unit can be designed to heat the at least one micromanipulator.

The micromanipulator unit can be designed to electrically heat the at least one micromanipulator. The at least one particle beam can be designed to heat the at least one micromanipulator of the at least one micromanipulator unit and/or the at least one single particulate by energy deposition on the micromanipulator and/or onto the at least one single particulate.

The at least one micromanipulator can be designed to comprise a metal or metal alloy that forms an alloy with the at least one single molten particulate.

If the material composition of the particulate to be removed has a low melting point and the micromanipulator of the micromanipulator unit has a material composition that can form an alloy with the material of the particulate to be removed, the particulate can be removed from the substrate by forming an alloy with the micromanipulator. Depending on the size of the individual particulates and their composition, the micromanipulator can take up multiple particulates before its uptake capacity for the material of the particulate(s) has been exhausted.

The at least one micromanipulator can comprise bismuth (Bi), a bismuth alloy and/or a bismuth coating, and the at least one constituent of the material composition of the at least one single particulate can comprise tin (Sn).

The entering of a particulate to be removed into an alloy with the micromanipulator is a further way of removing particulates containing low-melting metal from a substrate.

The alloy of bismuth and tin can have a material composition that ranges from Bi-40% Sn-60% to Bi-58% Sn-42%.

The at least one micromanipulator can comprise a carbon structure that takes up the at least one single heated particulate. The carbon structure of the micromanipulator can comprise at least one carbon nanotube (CNT) or at least one multiwall carbon nanotube (MWCNT). The carbon nanotube and/or the multiwall carbon nanotube can comprise a heated carbon nanotube and/or a heated multiwall carbon nanotube that wet the at least one single particulate. The at least one single particulate can comprise tin. The production and use of carbon nanotubes as measurement probes in scanning electron microscopes is described in the article: Z. W. Xu et al.: "Carbon nanotube AFM probe technology," https://doi.org/10.5772/17350.

A carbon nanotube can be electrically soldered. Therefore a carbon nanotube has an adhesive effect with respect to metals. A carbon nanotube or a heated carbon nanotube can therefore take up a low-melting metal-containing particulate, especially a tin-containing particulate, from a substrate surface through the effect of capillary forces.

The apparatus can comprise a voltage source designed to generate a flow of electrical current between the at least one micromanipulator and the at least one single particulate that causes electromigration in the at least one single particulate.

The voltage source can be designed to adjust a polarity of the current flow such that the ions of the at least one single particulate move in the direction of the at least one micromanipulator of the at least one micromanipulator unit. The at least one micromanipulator unit and/or the at least one particle beam can be designed to additionally heat the at least one single particulate during the flow of current through the particulate.

The apparatus can further include a sample stage which is designed to establish electrical contact with the substrate, and which also has an interface for connection of an electrical voltage source.

The apparatus can also include: an injection system designed to cover the at least one single particulate with oil. The injection system can be designed to cover the at least one single particulate with oil prior to processing of the particulate.

Coverage of a particulate with an oil has two advantages. Firstly, coverage of the particulate with an oil can reduce the influence of the atmospheric oxygen on the particulate during a processing operation. Secondly, the application of an oil film to a particulate to be processed facilitates the transfer of heat to the particulate.

The at least one particle beam can be designed to initiate electrostatic charging of the at least one single particulate prior to provision of a matched gas to the at least one single particulate, where the matched gas deposits material on the particulate.

Electrostatic charging of a particulate to be processed permits specific deposition of material onto the particulate to be processed. The deposition of material onto the material to be removed increases its surface area, which facilitates removal of the particulate from the substrate. In the simplest case, the particulate of increased size can be removed from the substrate with the aid of a cleaning operation thereon. In general, an enlarged particulate can be moved on the surface of a substrate in a relatively simple manner by use of one or more micromanipulators of a micromanipulator unit.

The analysis unit can select a matched gas having a deposition rate on the at least one single particulate which is greater than on the substrate by a factor of 2, preferably by a factor of 5, more preferably by a factor of 10, and most preferably by a factor of 30. Furthermore, it is advantageous to align the particle beam that induces the deposition operation or scan thereof with the matched gas.

The at least one single particulate can comprise an element from the group of: a particulate which is unstable with respect to removal from the substrate, a particulate having two or more particulate fragments, and a particulate comprising a particulate agglomerate, and the gas injection system can further be designed to provide, prior to the removal, a matched gas in an environment of the at least one single particulate that deposits material on the at least one single particulate.

If a particulate to be removed from a substrate is unstable, comprises multiple particulates or comprises a localized agglomerate of small particulates, it is advantageous to stabilize this particulate by deposition of material prior to a processing operation, such that the stabilized particulate can be removed from the substrate as a whole.

The micromanipulator unit can be designed to remove a first portion of the at least one single particulate, and the matched gas can contribute to removal of a second portion of the at least one single particulate by spontaneous etching and/or by particle beam-induced etching.

When a particulate is lifted from a substrate surface by use of a micromanipulator, a particulate residue may remain on the surface of the substrate. The residue remaining on the substrate surface can, in a second step, be removed from the substrate with the aid of a spontaneous or particle beam-induced etching operation.

The gas injection system can also be designed, after the removal of the at least one single particulate, to provide a reconstruction gas in the environment of the at least one single removed particulate that at least partly eliminates damage to the substrate that has arisen during the removal of the at least one single particulate.

The reconstruction gas can comprise at least one element from the group of: a metal carbonyl, for example chromium hexacarbonyl ($Cr(CO)_6$), tetraethyl orthosilicate (TEOS, $Si(OC_2H_5)_4$) and nitrogen dioxide ($NO_2$).

The gas injection system can also be designed, after the removal of the at least one single particulate, to provide a passivation gas in the environment of the at least one single removed particulate that, on conclusion of the processing operation on the at least one single particulate, prevents damage to the substrate by matched gas that is still present.

A passivation gas can comprise at least one element from the group of: water vapor ($H_2O$), nitrogen dioxide ($NO_2$), nitrogen monoxide (NO), oxygen ($O_2$), nitrosyl chloride (NOCl) and TEOS.

With the aid of the microscopy system of the above-defined apparatus, it is possible to inspect damage to the substrate that has occurred as a result of a particulate removal operation. With the aid of the analysis unit and the gas injection system of the apparatus, it is firstly possible to minimize the damage and secondly to very substantially eliminate damage to the substrate that has occurred in a downstream repair or reconstruction step.

In one embodiment, a method of removing at least a single particulate from a substrate, especially an optical element for extreme ultraviolet (EUV) photolithography, comprises the steps of: (a) determining at least one constituent of a material composition of the at least one single particulate; and (b) providing a gas matched to the particular constituent of the material composition in an environment of the at least one single particulate, (c) wherein the matched gas contributes to removing the at least one single particulate from the substrate.

The method of removing at least a single particulate can further comprise the step of: executing a particle beam-induced etching operation with an etching gas for removal of at least a first single particulate, before determining at least one constituent of the material composition of at least a second single particulate. The etching gas can comprise xenon difluoride ($XeF_2$). In addition, the etching gas can comprise an additive gas, for example oxygen ($O_2$).

The method according to the invention can be executed as a two-stage operation. In a first process step, by executing a conventional EBIE operation, a first portion of the particulates present on the substrate is removed by executing a local particle beam-induced etching operation. In a second process step, the material composition of the remaining second portion of particulates is at least partly determined with the aid of the analysis unit. The second portion of the particulates is then removed from the substrate with the aid of one or more matched gases by executing a spontaneous and/or particle beam-induced etching operation.

A computer program can include instructions which, when executed by a computer, cause the apparatus according to any of the above-specified aspects to execute the method steps of the above method.

BRIEF DESCRIPTION OF DRAWINGS

The detailed description that follows describes currently preferred working examples of the invention with reference to the drawings, wherein.

DETAILED DESCRIPTION

In the following currently preferred embodiments of the apparatus of the invention and of the method of the invention for removal of at least a single particulate on a substrate are explained in detail. The apparatus of the invention and the method of the invention are described hereinafter using the example of a photomask for the extreme ultraviolet (EUV) wavelength range. However, these are not limited to the examples described hereinafter. Instead, these can be used for processing or for removal of particulates from any kind of photomask. Furthermore, the apparatus described and the corresponding method can be used for processing of particulates present on components of a photolithographic exposure system, especially optical components having optical properties that are impaired by the presence of particulates. Moreover, as a person skilled in the art will easily see, the apparatus of the invention and the method of the invention can likewise be utilized for removal of particulates from templates that are used in different modes of nanoscale imprint lithography.

Figure 1:
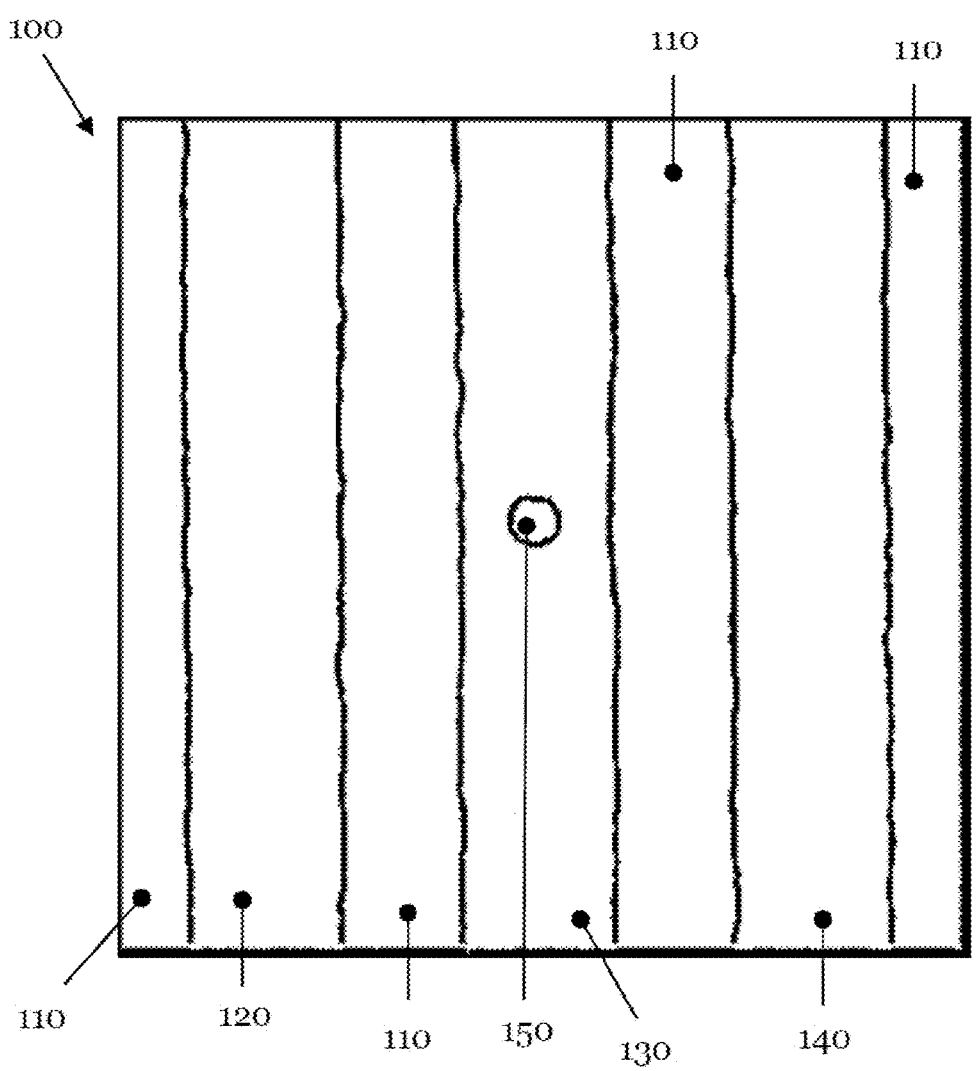
FIG. 1 shows a schematic of a detail of a top view of a photolithographic mask on which there is a single particulate which can be removed with the aid of a cleaning operation.

FIG. 1 shows a top view of a detail of a photolithographic mask 100. The detail of the photolithographic mask 100 presents a substrate 110 on which there are disposed three pattern elements 120, 130, 140 of absorbing material in the form of vertical strips. On account of the localization of the particulate 150 on one of the pattern elements, namely the pattern element 130, the particulate 150 can be removed from the photomask 100 with the aid of a cleaning operation. Typically, the pattern elements 120, 130, 140 have a height of 50 nm to 200 nm.

Figure 2:
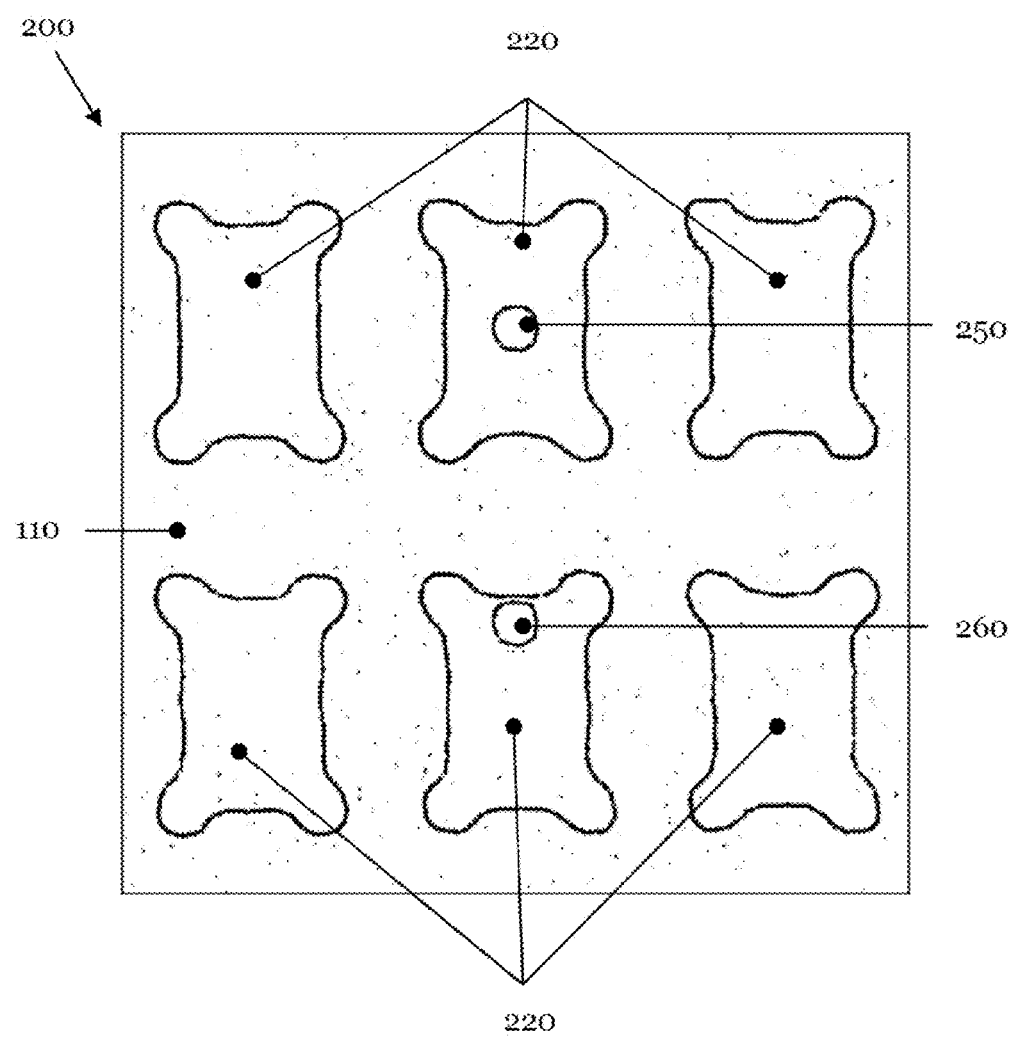
FIG. 2 presents a schematic of a detail of a top view of a photolithographic mask on which there are two single particulates not removable by use of a cleaning operation.

FIG. 2 likewise depicts a detail of a top view of a photolithographic mask 200. The illustrative mask 200 has a substrate 110. Two rows with a total of six contact holes 220 have been introduced into the substrate 110 of the mask 200. A single particulate 250 is present in an essentially central position in the middle contact hole 220 of the upper row. In the lower row, a single particulate 260 is localized at the upper edge of the middle contact hole 220. Typically, a contact hole 220 has a depth in the range of 50 nm to 200 nm. Neither particulate 250 nor 260 can be removed from the mask 200 by use of a cleaning operation. In addition to the particulates 250, 260 that are present in a depression of a photomask 200, even single particulates adsorbed at the edge of a pattern element 120, 130, 140 and, in particular, in corners of a pattern element can be removed from the mask 100, 200 only with great difficulty, if at all, with the aid of a cleaning operation. The description of the removal of single particulates 250, 260 from photomasks that follows relates to particulates 250, 260 that cannot be removed from a photomask 200 by use of a cleaning operation, or particulates that can be removed from a photomask with great difficulty with the aid of a cleaning operation only.

Figure 3:
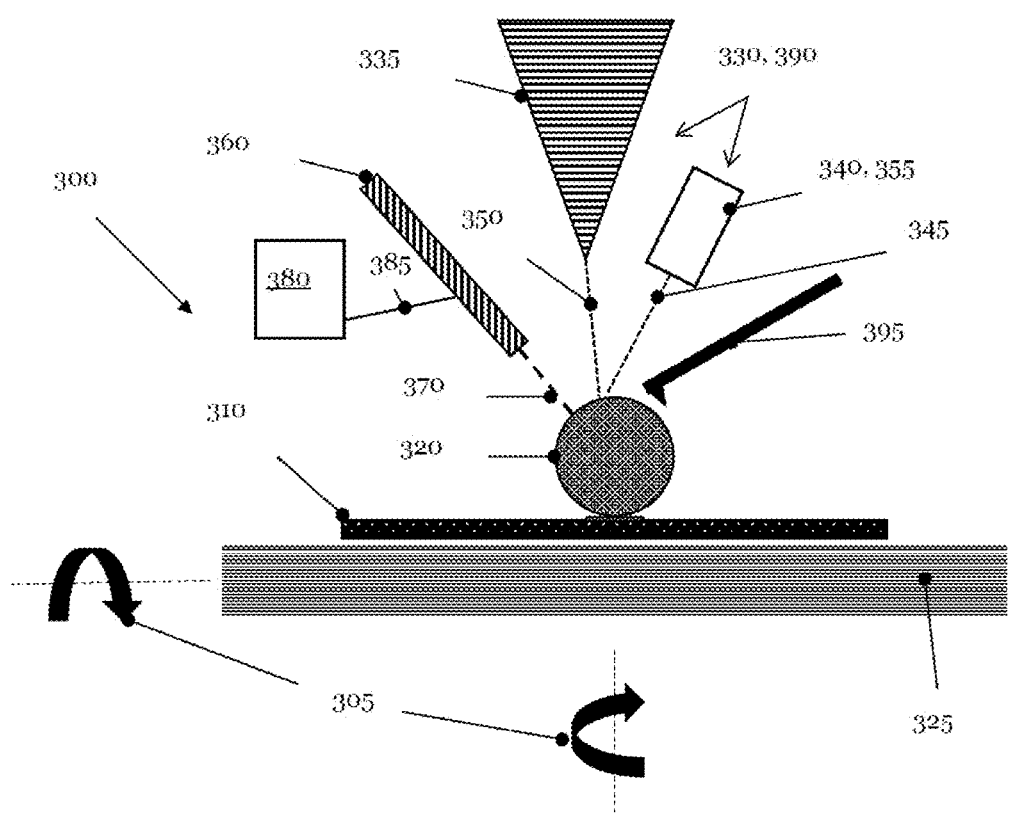
FIG. 3 presents a schematic of some components of an apparatus for removal of a single particulate from a substrate.

FIG. 3 depicts a schematic of some components of an apparatus 300 that enables processing and/or removal of one or more particulates 320 from a substrate 310. The substrate 310 can comprise a substrate 110 of a photomask 100, 200. The substrate 310 can comprise a substrate 110 of any kind of photomask 100, 200. More particularly, the substrate 310 can include an EUV mask. But the substrate 310 can also include an optical component of a mask exposure system, especially an exposure system for the EUV wavelength range.

The substrate 310 can be disposed on a sample stage 325. As indicated by the curved arrows 305 in FIG. 3, the sample stage 325 can be rotatable about one, two or three axes. This enables processing of a particulate 320 at various angles. In addition, the sample stage 325 can be moved in two directions, for example in the plane of the sample stage 325, or in three spatial directions, i.e. additionally at right angles to the plane of the sample stage 325 (not shown in FIG. 3). The sample stage 325 can have an electrical terminal, with the aid of which an electrical potential can be applied to the substrate 310 or to the particulate 320 (not depicted in FIG. 3).

In FIG. 3, the illustrative particulate 320 has a spherical shape. However, a particulate 320 to be removed from the substrate 310 does not need to have a spherical form. Instead, the particulate 320 may be in any form. The particulate 320 may have a diameter in the range from about 1 nm to about 100 µm. In addition, the particulate 320 may interact in any way with the substrate 310. For example, the particulate 320 may stick to the particulate 320 and/or the substrate 310 by virtue of van der Waals forces, or by virtue of a chemical bond or an electrostatic charge thereon.

The particulate 320 may comprise a pure metal and/or a metal alloy. The particulate 320 may comprise an oxide, a halide, a nitride, a sulfide, a phosphide, a salt or an organic compound. An organic compound may comprise a carbon compound, a carbon-hydrogen compound and a photoresist.

The apparatus 300 can include an analysis unit 330. The analysis unit 330 can include a particle beam source 335 that can generate a particle beam 350 that can be directed onto the particulate 320 in the form of a focused particle beam 350. The particle beam 350 can include a beam of photons from the visible, ultraviolet (UV), deep ultraviolet (DUV) and/or extreme ultraviolet (EUV) wavelength range. The particle beam 350 can comprise an electron beam, an ion beam, an atomic beam and/or a molecular beam. The particle beam source 335 can further comprise a scanning device that can scan the particle beam 350 across the particulate 320 (not shown in FIG. 3). The analysis unit 330 can comprise a detector 340 that can detect particles 345 originating from the particulate 320. The particles 345 or the particle beam 345 can comprise particles that the particle beam 350 incident on the particulate 320 releases from the particulate 320. The detector 340 can analyze the particles 345 or the particle beam 345 and, based on this analysis, determine the most important constituent(s) of the particulate 320. The most important constituent(s) of the particulate 320 are typically the constituents of its material composition that have the greatest percentages of its material composition.

The analysis unit 330 can be executed, for example, in the form of an energy-dispersive x-ray spectroscopy unit and/or a secondary ion mass spectrometry unit.

The particles 345 or the particle beam 345 can alternatively include particles of the incident particle beam 350 that are reflected by the particulate 320 or by the substrate 310 surrounding the particulate 320. If the particle beam 345 includes predominantly reflected particles of the particle beam 350, the particle beam source 335 and the detector 355 form a microscopy system 390 that can be used for imaging of the particulate 320. The analysis unit 330 can thus be combinable with a microscopy system 390. It is alternatively possible that the apparatus 300 in each case has a standalone analysis unit 330 and a standalone microscopy system 390.

In addition, the apparatus 300 includes a gas injection system 360 that can provide a matched gas 370 at or in an environment of the particulate 320. The gas injection system 360 can be connected to a control unit 380 via a connection 385. The control unit 380 can firstly monitor the gas composition of the matched gas 370, and can secondly control a gas flow rate of the matched gas 370 under open-loop or closed-loop control. In addition, the control unit 380 can include a connection to the analysis unit 330, which is suppressed in FIG. 3 for reasons of clarity. Via this connection, the control unit receives information as to the composition of the particulate 320 and the matched gas 370. In addition, the gas injection system 360 can also provide a reconstruction gas and/or a gas for deposition of a protective layer around and/or onto the particulate 320 to be removed.

Finally, the apparatus 300 comprises a micromanipulator unit 395 designed to process the particulate 320. Micromanipulator units 395 are described in detail in the context of FIGS. 5 to 7.

Figure 4A:
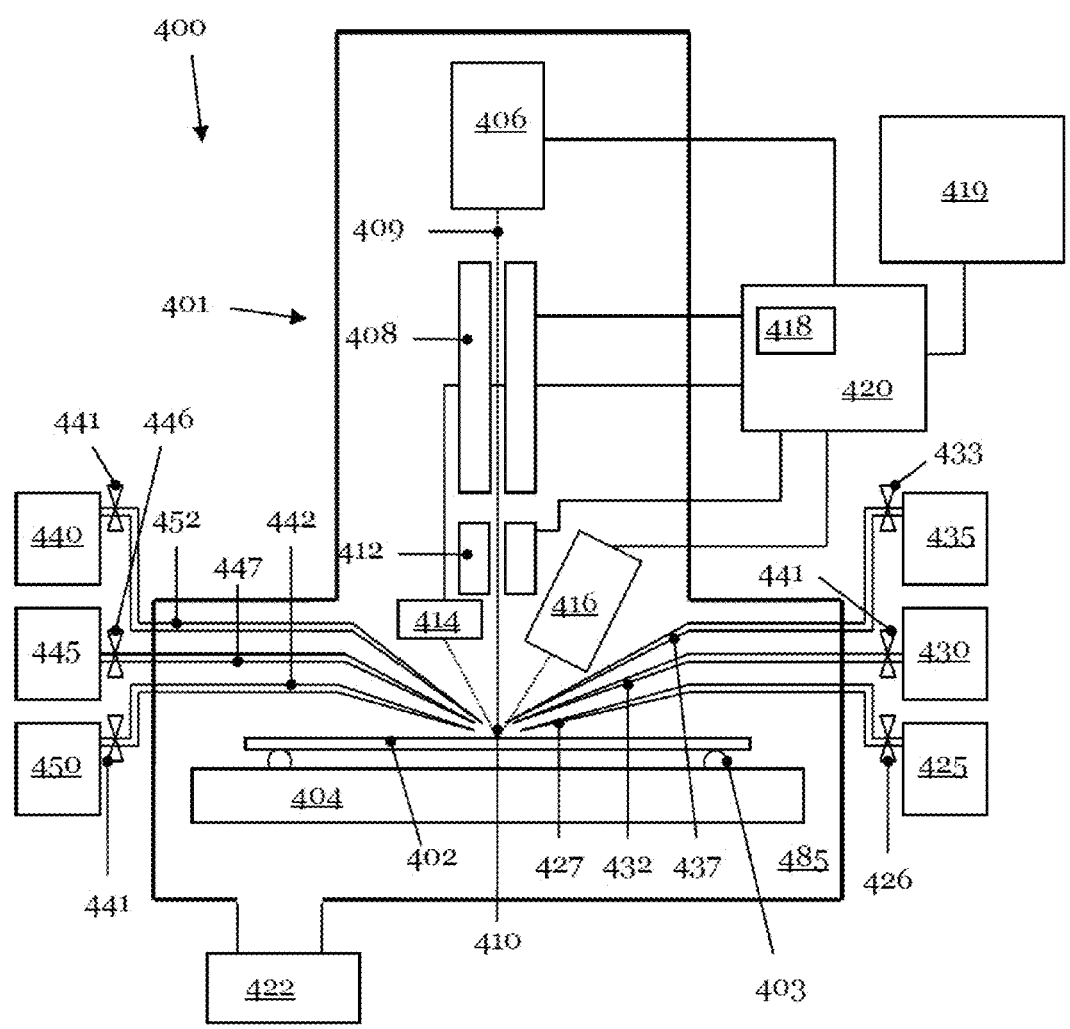
FIG. 4A illustrates a section through a schematic block diagram of some important components of an apparatus that can be used for processing or removal of one or more particulates from a substrate.
Figure 4B:
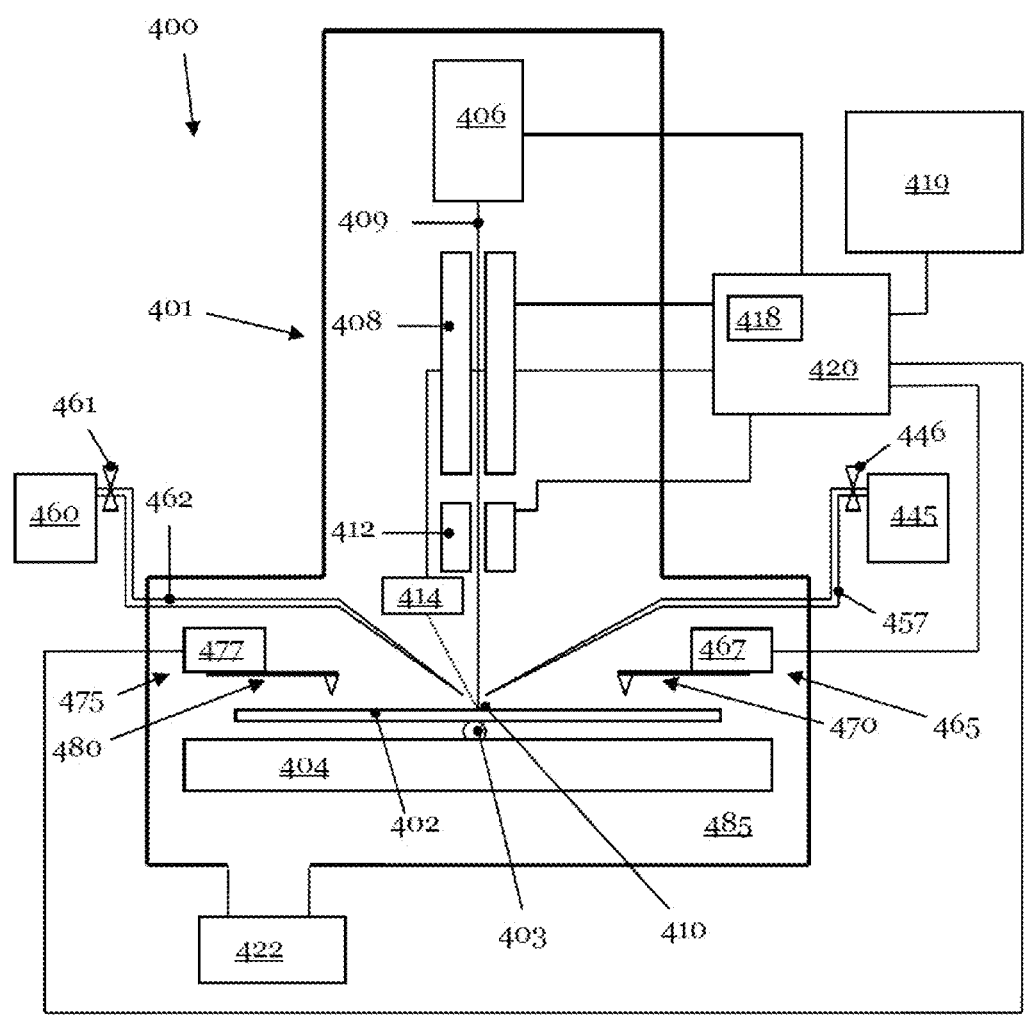
FIG. 4B shows a section through the apparatus from FIG. 4A in which the sectional plane is rotated by 90° relative to FIG. 4A.

FIG. 4A shows a schematic of a section through essential components of an apparatus 400 that can be used for removal of one or more particulates 320 from the substrate 310, for example a photolithographic mask 100, 200. FIGS. 4A and 4B should be seen as interrelated. FIG. 4B presents a section through essential components of the apparatus 400 from FIG. 4A, in which the plane of the section is rotated by 900 relative to FIG. 4A. FIGS. 4A and 4B show a working example of the apparatus 300 from FIG. 3 in greater detail.

As already discussed in the context of FIG. 3, the substrate 402 can be any optical component of a photolithographic exposure system, any photomask 100, 200, or a template for the nanoimprinting technique. As well as the processing of photomasks, the apparatus 400 can, however, also be used for processing, for example, of an integrated circuit, a microelectromechanical system (MEMS) and/or a photonic integrated circuit that have excess material in the form of particulates 320 at locations that are difficult to access.

The illustrative apparatus 400 in FIGS. 4A and 4B are a modified scanning electron microscope (SEM) 401 comprising two micromanipulator units 465 and 475 in the form of atomic force microscopes (AFMs). An electron gun 406 generates an electron beam 409, which is directed by the elements 408 and 412 as a focused electron beam 410 onto the substrate 402 disposed on a sample stage 404 in a three-point bearing arrangement 403.

The sample stage 404 has adjusting devices (not shown in FIGS. 4A and 4B), with the aid of which the position on the substrate 402 which has the particulate 320 (not shown in FIGS. 4A and 4B) can be brought beneath the point of incidence of the electron beam 410 on the substrate 402 and/or into the processing region of the AFMs 465 and 475. In addition, the sample stage 404 can be displaced in height, i.e. in z direction or in beam direction of the electron beam 409, such that the focus of the electron beam 410 comes to rest at the surface of the substrate 404 (likewise not illustrated in FIGS. 4A and 4B). Furthermore, the sample stage 404 can comprise an apparatus for setting and controlling the temperature, which makes it possible to bring the substrate 402 to a given temperature and to keep it at that temperature (likewise not indicated in FIGS. 4A and 4B).

The apparatus 400 in FIGS. 4A and 4B uses an electron beam 409 as energy source for initiating a local chemical reaction of a matched gas 370. According to the embodiment, a matched gas 370 can execute a local etching reaction or a local deposition reaction. An electron beam 410 can be focused onto a small focal spot having a diameter of <1 nm. In addition, electrons that are incident on the surface of the substrate 402 cause hardly any damage to the substrate surface, even if their kinetic energy varies over a large energy range.

However, the apparatus 400 and the method presented here are not restricted to the use of an electron beam 409. Instead, it is possible to use any desired particle beam able to bring about a local chemical reaction of a matched gas 370 at the point of incidence of the particle beam on the surface of the substrate 402. Examples of alternative particle beams are an ion beam, an atomic beam, a molecular beam and/or a photon beam. Furthermore, it is possible to use two or more particle beams in parallel. In particular, it is possible simultaneously to use an electron beam 409 and a photon beam as energy source (not shown in FIGS. 4A and 4B). This means that the apparatus 400 can use an electron beam 409 as part of the analysis unit 330, and a photon beam as part of a microscopy system 390.

The electron beam 409 and optionally the photon beam can be utilized for recording of an image of the substrate 402, especially of the region of the substrate 402, containing excess material in the form of one or more particulates 320. The electron beam 409 can thus be used for localizing, imaging and analyzing a particulate 320. A detector 414 for detecting backscattered electrons and/or secondary electrons supplies a signal that is proportional to the surface contour of the particulate 320 and/or to the composition of the substrate 402 or of the particulate 320.

By scanning or raster-scanning the focused electron beam 410 over the substrate 402 with the aid of a control unit 418, a computer system 420 of the apparatus 400 can generate an image of the substrate 402 or the particulate 320. The control unit 418 can be part of the computer system 420, as illustrated in FIGS. 4A and 4B, or can be executed as a separate unit (not illustrated in FIGS. 4A and 4B). The computer system 420 can include algorithms that are implemented in hardware, software, firmware or a combination thereof and which make it possible to extract an image from the measurement data from the detector 414.

In addition, the computer system 420 can include algorithms that use the measurement data from the detector 414 to determine the essential constituents of the material composition of the particulate 320. Moreover, the computer system 420 can comprise a machine learning model and/or a predictive filter designed to use the measurement data from the detector 414 to predict at least one essential constituent of the material composition of the particulate 320.

A screen 419 of the computer system 420 can show the calculated image and/or the material composition of the particulate 320. Furthermore, the computer system 420 can store the measurement data from the detector 414, the calculated image and/or the composition of the particulate 320. In addition, the control unit 418 of the computer system 420 can control the electron cannon 406 and the beam-imaging and beam-shaping elements 408 and 412. Control signals from the control unit 418 can additionally control the movement of the sample stage 404 under open-loop or closed-loop control by use of adjusting devices (not indicated in FIGS. 4A and 4B). In addition, the control unit 418 can move the micromanipulator units 470 and 480, especially relative to the particulate 320.

The electron beam 410 incident on the substrate 402 can electrostatically charge the particulate 320 and/or the substrate 402 surrounding the particulate 320. Electrostatic charging of the particulate 320 can be desirable in order to facilitate interaction of the particulate 320 with one or both micromanipulator units 470, 480. In order to electrostatically charge the particulate 320 in a controlled manner, it is possible to use an ion gun (flood gun) 416 in order to irradiate the particulate 320 and/or the surface of the substrate 402 with ions of low kinetic energy. By way of example, it is possible to use argon ions having a kinetic energy of a few hundred eV for this purpose.

In order to dispose of the particulate 320 on the substrate 402 disposed on the sample stage 404, the illustrative apparatus 400 in FIGS. 4A and 4B comprises, e.g., eight reservoir vessels for eight different processing gases or precursor gases. The first reservoir vessel 425 stores a first etching gas, for example xenon difluoride ($XeF_2$) and/or nitrosyl chloride (NOCl). The etching gas can be used to remove one or more particulates 320 from the substrate 402 in a non-matched local etching operation.

The second reservoir vessel 430 stores a first deposition gas. The first deposition gas can comprise, for example, a carbon-containing deposition gas, for example a metal carbonyl, for instance tungsten hexacarbonyl ($W(CO)_6$). The first deposition gas is preferably utilized in order to deposit a locally limited protective layer on the substrate 402 around the particulate 320 to be removed.

The third reservoir vessel 435 stores a second deposition gas. The second deposition gas can comprise a metal carbonyl, for instance chromium hexacarbonyl ($Cr(CO)_6$). The second deposition gas is typically used to stabilize a fragile particulate 320 by deposition of material onto the particulate 320. In addition, the second deposition gas can be used to increase the surface area of the particulate 320 by deposition of additional material thereon, and hence to facilitate the removal of the enlarged particulate from the substrate 402.

The fourth reservoir vessel 440 stores a first matched gas, for example hydrogen ($H_2$) or an organic compound in combination with water vapor ($H_2O$). The first matched gas is chosen such that it spontaneously etches a particulate 320 to be removed without significantly attacking the substrate 402 that surrounds the particulate 320 or a deposited locally limited protective layer.

A fifth reservoir vessel 445 stores a second matched gas. The second matched gas can comprise, for example, ammonia ($NH_3$), ammonium carbamate ($H_2NCOONH_4$) and/or ammonium carbonate (($NH_4)_2CO_3$).

A sixth reservoir vessel 450 stores a passivation gas. The passivation gas can comprise a metal carbonyl and/or TEOS. The passivation gas can be added to the first and/or second matched gas 370 in order to minimize damage to the substrate 402 surrounding the particulate 320.

A seventh reservoir vessel 455 stores a reconstruction gas. The reconstruction gas can comprise at least one element from the group of gases: nitrogen oxide (NO, $NO_2$), water vapor ($H_2O$), oxygen ($O_2$), chromium hexacarbonyl ($Cr(CO)_6$), and TEOS. The reconstruction gas enables after-treatment of the substrate 402 in the region of the particulate 320 in order to eliminate damage to the substrate 402 that has arisen during the particulate removal.

Finally, the eighth reservoir vessel 460 stores an additive gas. The additive gas can comprise an additional oxidizing agent, for example an element from the group: oxygen ($O_2$), ozone ($O_3$), water ($H_2O$), heavy water ($D_2O$), hydrogen peroxide ($H_2O_2$), dinitrogen monoxide ($N_2O$), nitrogen monoxide (NO), nitrogen dioxide ($NO_2$), nitric acid ($HNO_3$) and other oxygen-containing compounds. In a second embodiment, the additive gas comprises a gas having reducing action, for instance hydrogen ($H_2$) or ammonia ($NH_3$).

An additive gas in the form of an oxidizing agent or a reducing agent can be utilized, for example, in order to increase selectivity in the execution of a local etching operation with the first and/or second matched gas for removal of the particulate 320.

In the example depicted in FIGS. 4A and 4B, each reservoir vessel 425, 430, 435, 440, 445, 450, 455, 460 has its own control valve 426, 431, 436, 441, 446, 451, 456, 461, in order to monitor or control the level of the corresponding gas that is provided per unit time, i.e. the gas flow rate at the point of incidence of the electron beam 410 and/or at the location of the particulate 320. The control valves 426, 431, 436, 441, 446, 451, 456, 461 are controlled and supervised by the control unit 418 of the computer system 420. It is thus possible to adjust the partial pressure ratios of the gas(es) provided at the processing site within a wide range.

In addition, in the illustrative apparatus 400, each reservoir vessel 425, 430, 435, 440, 445, 450, 455, 460 has its own gas injection system 427, 432, 437, 442, 447, 452, 457, 462, which ends with a nozzle in the vicinity of the particulate 320. In an alternative embodiment (not represented in FIGS. 4A and 4B), a gas injection system in the form of a mixing tube is used to provide two or more or all processing gases in a common stream at the surface of the particulate 320.

In the example illustrated in FIGS. 4A and 4B, the valves 426, 431, 436, 441, 446, 451, 456, 461 are arranged in the vicinity of the corresponding vessels 425, 430, 435, 440, 445, 450, 455, 460. In an alternative arrangement, the control valves can be incorporated in the vicinity of the corresponding nozzles (not shown in FIGS. 4A and 4B). By contrast with the illustration shown in FIGS. 4A and 4B and in a currently non-preferred manner, it is also possible to provide one or more of the gases stored in the vessels 425, 430, 435, 440, 445, 450, 455, 460 in an undirected manner in the lower portion of the vacuum chamber 485 of the apparatus 400. In this case, it is necessary for the apparatus 400 to incorporate a stop (not illustrated in FIGS. 4A and 4B) between the lower reaction space and the upper portion of the device 400, which provides the electron beam 409, in order to prevent an excessively low vacuum in the upper portion of the apparatus 400.

Each of the reservoir vessels 425, 430, 435, 440, 445, 450, 455, 460 can have its own temperature setting element and control element that enables both cooling and heating of the corresponding reservoir vessels. This makes it possible to store and provide the deposition gases, the etching gas, the matched gases, the reconstruction gas and/or the additive gas at the respective optimal temperature (not shown in FIGS. 4A and 4B). Furthermore, each feed system 427, 432, 437, 442, 447, 452, 457, 462 can comprise its own temperature setting element and temperature control element in order to provide all the process gases at their optimal processing temperature at the point of incidence on the particulate 320 (likewise not indicated in FIGS. 4A and 4B). The control unit 418 of the computer system 420 can control the temperature setting elements and the temperature control elements both of the reservoir vessels 425, 430, 435, 440, 445, 450, 455, 460 and of the gas injection systems 427, 432, 437, 442, 447, 452, 457, 462. The reservoir vessels 425, 430, 435, 440, 445, 450, 455, 460 can be executed in the form of gas cylinders. The control valves 426, 431, 436, 441, 446, 451, 456, 461 can be implemented as flow regulators.

The apparatus 400 in FIGS. 4A and 4B comprises a pump system 422 for generating and maintaining a vacuum required in the vacuum chamber 485. With closed control valves 426, 431, 436, 441, 446, 451, 456, 461 a residual gas pressure of $\leq 10^{-7}$ mbar is achieved in the vacuum chamber 485 of the apparatus 400. The pump system 422 can comprise separate pump systems for the upper portion of the apparatus 400 for providing the electron beam 409, and the lower portion 495 comprising the sample stage 404 with the substrate 402.

Finally, the illustrative apparatus 400 has two scanning probe microscopes 465 and 475 in the form of atomic force microscopes (AFMs). The measurement heads 467 and 477 of the AFMs 465 and 475 can accommodate micromanipulator units 470, 480. The measurement heads 467 and 477 of the AFMs 465, 475 can move the micromanipulator units 470, 480 at least in two, preferably in three, spatial directions, and hence act as movement apparatuses 467, 477 for the micromanipulator units. The AFMs 465 and 475 are controlled by the control unit 418 of the computer system 420. Execution of a method of the invention does not require the apparatus 400 to have two scanning probe microscopes 465, 475. One scanning probe microscope 465 or 475 equipped with a micromanipulator unit 470 or 480 is sufficient for processing and/or removal of a particulate 320 from the substrate 402 (not shown in FIGS. 4A and 4B).

Figure 5:
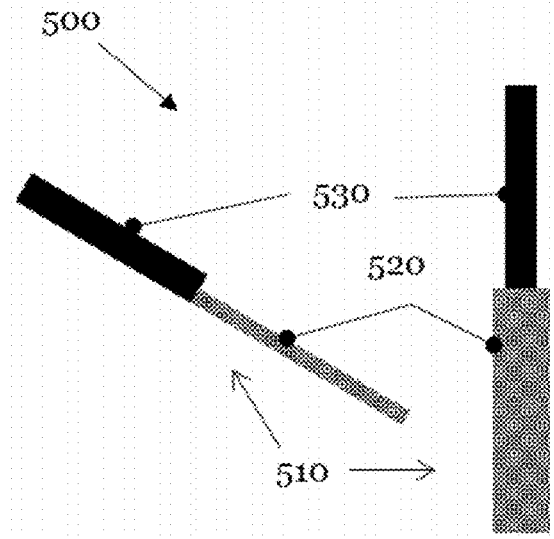
FIG. 5 shows a schematic of a first working example of a micromanipulator unit.

The diagram 500 in FIG. 5 shows an example of a micromanipulator unit 510. The left-hand part of the image depicts a side view, and the right-hand part of the image a top view, of the micromanipulator unit 510. The micromanipulator unit 510 comprises a securing section 530 that enables incorporation of the micromanipulator unit 510 in a measurement head 447,467 of a scanning probe microscope 465, 475. The micromanipulator unit 510 can comprise a metal, a metal compound, a semiconductor material and/or a compound semiconductor.

In addition, the micromanipulator unit 510 comprises a micromanipulator 520 which, in the example shown in FIG. 5, has a broad and flat shape. The width of the micromanipulator 520 can comprise a range from 1 nm to 100 μm, especially a range from 10 nm to 100 nm. The thickness of the micromanipulator 520 can range from 5 nm to 10 μm. Preference is currently given to a thickness in the range of 5 nm to 500 nm.

Figure 6:
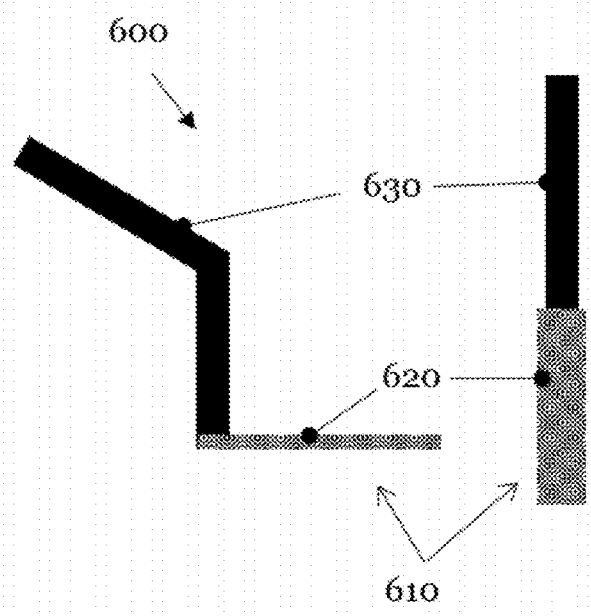
FIG. 6 presents a schematic of a second working example of a micromanipulator unit.

The diagram 600 in FIG. 6 presents a second working example of a micromanipulator unit 470, 480. Similarly to FIG. 5, the left-hand part of the image shows a side view and the right-hand part of the image a top view of the L-shaped micromanipulator unit 610. The latter comprises an angled securing section 630 and a ladle-shaped micromanipulator 620. The securing section 630 typically has a length in the range from 100 nm to 10 mm, especially from 100 nm to 10 μm. The width of the ladle-shaped micromanipulator 620 encompasses dimensions from 10 nm to 10 mm, preferably from 10 nm to 10 μm. The thickness of the micromanipulator 620 ranges from 5 nm to 10 μm, especially from 5 nm to 500 nm.

Figure 7:
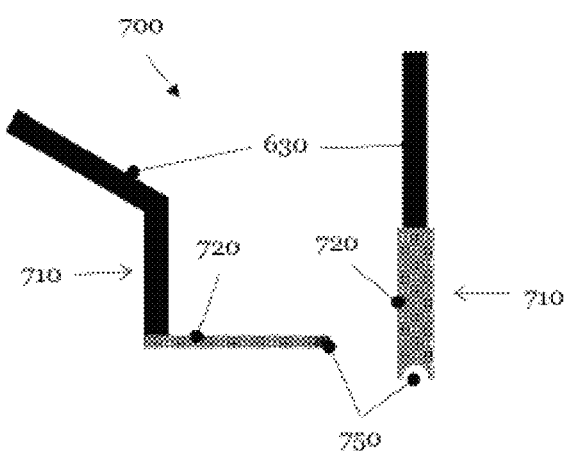
FIG. 7 depicts a schematic of a third working example of a micromanipulator unit.

Diagram 700 in FIG. 7 shows a modification of the L-shaped micromanipulator unit 610 from FIG. 6. In addition to the micromanipulator 620, the ladle of the micromanipulator 720 has a notch or a recess 750. The notch 750 can have dimensions in the range from 5 nm to 8 mm, especially from 5 nm to 5 μm. The notch 750 facilitates the uptake of a particulate 320 from the substrate 310 by the micromanipulator 720.

The micromanipulator 520, 620, 720 can be electrically conductive or electrically insulating. A micromanipulator 520, 620, 720 can move a particulate 320 on the substrate 402, for example onto a pattern element 120, 130, 140 of a photomask 100, 200, such that the particulate 320 can be removed from the substrate 402, for example the photomask 100, 200, by use of a cleaning operation. In addition, a micromanipulator 520, 620, 720 can comminute a particulate 320 or take up a particulate 320 from the substrate 402. A micromanipulator 520, 620, 720 can interact with a particulate via van der Waals forces, an electrostatic charge on the particulate 320 and/or the micromanipulator 520, 620, 720, and/or via a chemical bond.

Figure 8:
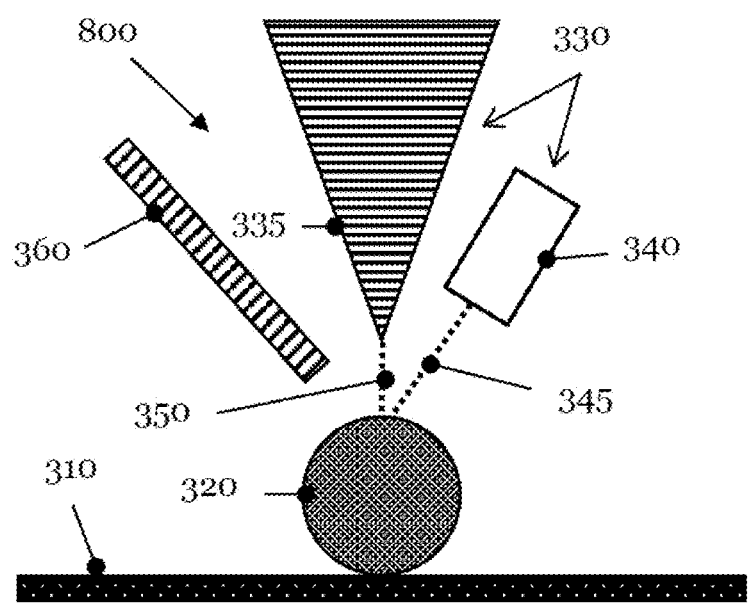
FIG. 8 presents a schematic section of a first working example for removal of a particulate by execution of a spontaneous etching operation with a matched gas.
Figure 8:
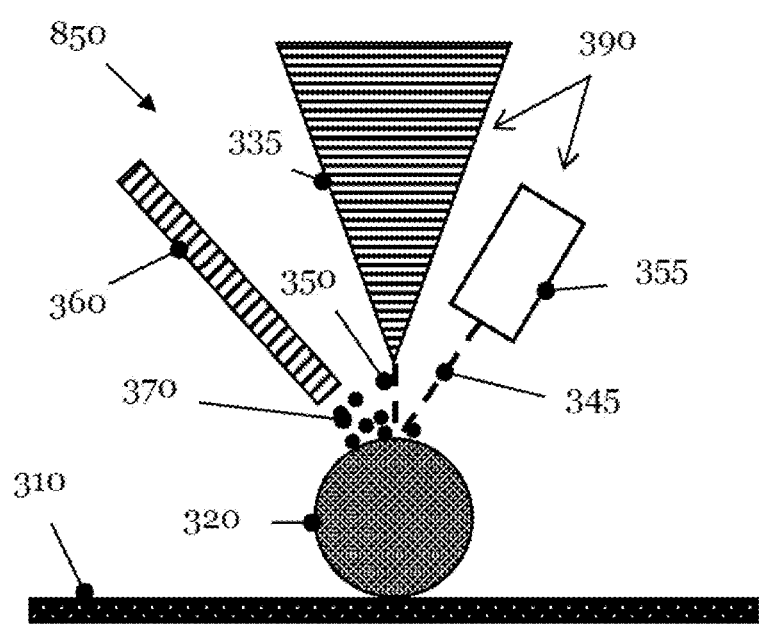

FIG. 8 shows a first working example of the removal of a particulate 320 from a substrate 310. The substrate 310 can comprise the substrate 402 of the apparatus 400 from FIGS. 4A and 4B. The upper part of the image 800 presents a schematic of the analyzing of an identified particulate 320 with the aid of an analysis unit 330 that has already been elucidated in connection with the description of FIG. 3. For this purpose, the analysis unit 330 irradiates the particulate 320 with a particle beam 350, for example an electron beam 350. The secondary electrons 345 reflected by the particulate 320 are detected by the detector 340 of the analysis unit 330. The analysis unit 330 uses the energy spectrum of the secondary electrons 345 to ascertain at least the essential constituents of the particulate 320. As already described above, the analysis unit 330, for this purpose, can use a correspondingly trained machine learning model and/or a predictive filter. Alternatively, the analysis unit 330 can use an ion beam to scan the particulate 320 and/or the substrate 310, and the detector 340 can analyze the particles released by the particulate.

The analysis unit 330 uses the composition ascertained to determine a matched gas 370 that spontaneously etches the particulate 320. If the essential constituent of the particulate 320 comprises silicon, it is possible to use xenon difluoride ($XeF_2$) as matched gas 370. For a particulate 320 having tin (Sn) as its main constituent, it is possible to use hydrogen ($H_2$) or nitrosyl chloride (NOCl) as the matched gas 370.

In the analysis step, the analysis unit 330 can likewise ascertain the composition of the substrate 310 surrounding the particulate 320 by scanning with the particle beam 350.

In determining the matched gas 370, the analysis unit 330 can take account of the material composition of the substrate 310, such that the subsequent etching step on the particulate 320 damages the surrounding substrate 310 only to a minimal degree. But it is also possible that the composition of the substrate 310 is already known to the analysis unit 330, for example by access to a material database.

If the analysis unit 330 is unable to find a matched gas 370 that spontaneously etches the particulate 320 without significantly damaging the substrate 310, the analysis unit 330 can stipulate deposition of a locally limited protective layer around the particulate 320 on the substrate 310 prior to commencement of the etching operation on the particulate 320. This operation is illustrated schematically in FIG. 9. For this purpose, the electron beam 350 of the analysis unit 330 performs an EBID (electron beam-induced deposition) operation. The deposition gas 970 required for the purpose is preferably a metal carbonyl and is stored in the second reservoir vessel 430.

The size and thickness of the locally limited protective layer 950 deposited depends on the size and chemical composition of the particulate 320 to be removed. For large particulates 320, the size of which extends to the region of 100 μm, the locally limited protective layer 950 can reach a diameter that comes close to the millimeter range. The thickness of the protective layer 950 to be deposited is guided by the material composition of the particulate 320 and hence by the spontaneous etching time that the protective layer 950 must be able to withstand. The thickness of the protective layer 950 is typically within a range from 5 nm to 1 μm.

In the second step of the spontaneous etching operation illustrated in FIG. 8, illustrated schematically in the lower part of the image 850, the gas injection system 360 provides the particular matched gas 370 at the site of the particulate 320, and the latter spontaneously etches the particulate 320 to be removed. The spontaneous etching operation on the particulate 320 can be observed by the microscopy system 390 of the apparatus 300, 400. The microscopy system 390 can use a particle beam 350 in the form of a photon beam for imaging of the particulate etching operation. The etching operation can alternatively be imaged using the analysis unit 330 (not shown in FIG. 8). In addition, it is possible to use either a microscopy system 390 or an analysis unit 330 for observation of the spontaneous particulate etching operation. On the basis of the data from the microscopy system 390 and/or the analysis unit 330, the control unit 380 (not depicted in FIG. 8) can control the gas flow rate of the matched gas 370 under open-loop or closed-loop control. More particularly, the gas flow rate of the matched gas 370 can be stopped after the etching operation has ended, and hence it is possible to prevent the matched gas 370 from damaging the substrate 310 to more than the extent necessary.

Figure 9:
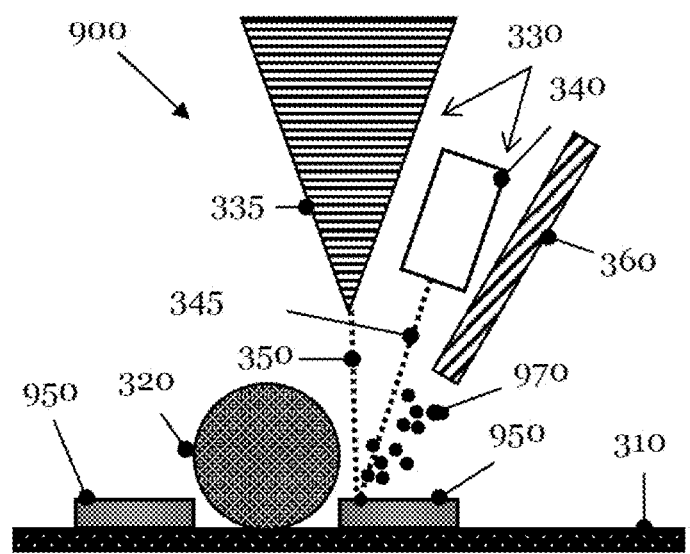
FIG. 9 shows a schematic of the placing or deposition of a locally limited protective layer around the particulate to be removed.

If the substrate 310 has a locally limited protective layer 950—as depicted schematically in FIG. 9—this is removed again from the substrate 310 in a second etching step after the removal of the particulate 320. This operation is shown schematically in FIG. 10 in the form of an EBIE (electron beam-induced etching) operation. The etching gas 1050 used for this purpose can, for example, be the xenon difluoride ($XeF_2$) etching gas stored in the first reservoir vessel 425. The etching operation on the protective layer 950 can be stopped at periodic time intervals in order to check the progress of etching with the aid of the analysis unit 330 and/or the microscopy system 390.

Figure 10:
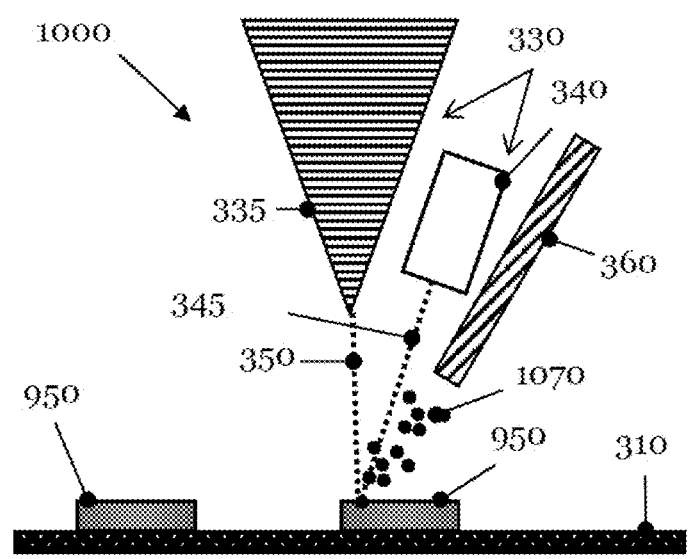
FIG. 10 illustrates the removal of the deposited locally limited protective layer after the removal of the particulate from the substrate.

In an alternative embodiment, the protective layer 950 can be removed from the substrate 310 in a spontaneous etching operation (not shown in FIG. 10). In order to spontaneously etch a protective layer that has been deposited on the basis of a metal carbonyl deposition gas 970, it is possible to use, for example, water ($H_2O$), oxygen ($O_2$), nitrogen monoxide (NO), nitrogen dioxide ($NO_2$), xenon difluoride ($XeF_2$), nitrosyl chloride (NOCl) or a combination of these gases.

Figure 11:
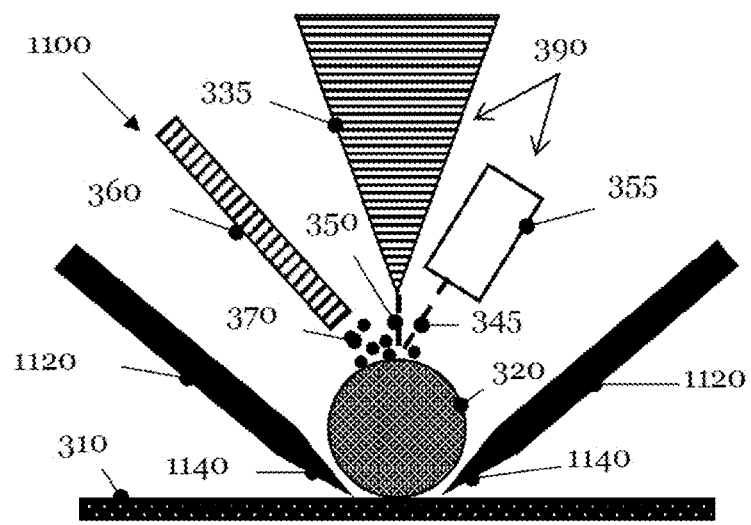
FIG. 11 shows, in schematic form, a first working example of the protection of the substrate surrounding a particulate to be removed with the aid of two micromanipulators.

Alternatively or additionally to the application of a protective layer 950, one or more micromanipulators can be positioned in the vicinity of the particulate 320 to be removed, in order to protect the substrate 310 from the action of the matched gas 370 during the particulate etching operation. FIG. 11 gives a schematic illustration of a first working example. Two micromanipulators 1120 are positioned in the vicinity of the particulate 320 to be removed. The securing sections of the micromanipulators 1120 are connected to the measurement heads 447, 467 of the scanning probe microscopes 465, 475. The measurement heads 447, 467 can be moved by the micromanipulators and should thus be disposed in the vicinity of the particulate 320.

The micromanipulators 1120 can be a modification of the flat broad micromanipulator 520 depicted in FIG. 5. The modification of the micromanipulator 520 is a narrowing of the opposite end from the securing section 530. The tip 1140 of the micromanipulator 1120 enables optimal approach of the micromanipulator 1120 to the particulate 320 to be removed. In the example presented in FIG. 11, two micromanipulators 1120 are opposite one another. This arrangement of the micromanipulators 1120 is favorable if damage to the substrate 310 predominantly in one direction is to be avoided. However, it is also possible to position two further micromanipulators 1120 rotated by 900 relative to the configuration illustrated in FIG. 11 around the particulate 320 (not shown in FIG. 11). It is of course also possible, if required, to use just one micromanipulator 1120 for protection of the substrate 310 (likewise not illustrated in FIG. 11).

Figure 12:
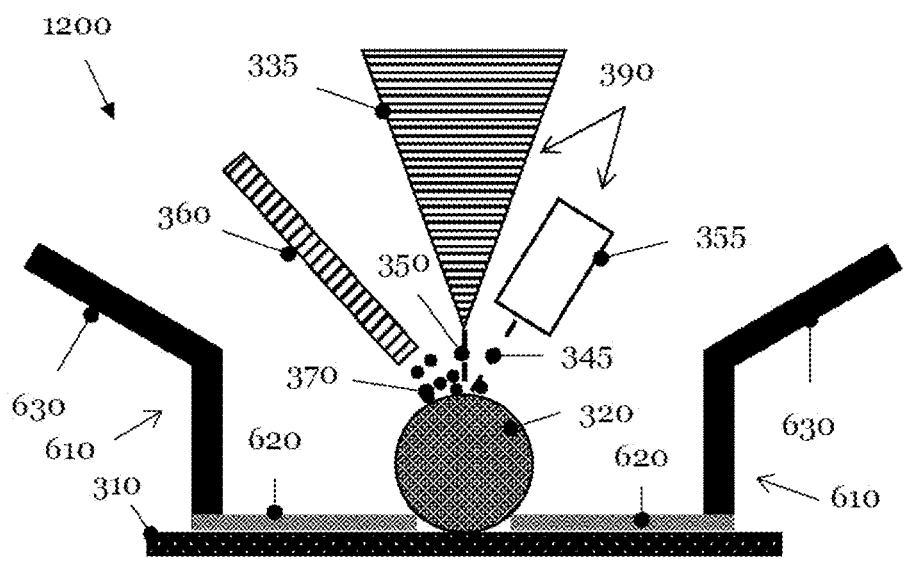
FIG. 12 depicts, in schematic form, a second working example of the protection of the substrate surrounding a particulate to be removed with the aid of two micromanipulators.

FIG. 12 shows a second working example of the protecting of the substrate 310 during a particulate etching operation. In the example illustrated in FIG. 12, two ladle-shaped micromanipulators 620 of the micromanipulator type 620 indicated in FIG. 6 are used to protect the substrate 310. As set out above in the context of FIG. 11, it is of course possible to use a single micromanipulator 620, or four micromanipulators 620, preferably arranged at right angles to one another. It is additionally possible, rather than the micromanipulator 620, to use the micromanipulator 720 in the second working example illustrated in FIG. 12.

The protection of the substrate 310 with the aid of one or more micromanipulators 620, 1120 has greater flexibility compared to the deposition of a protective layer 950. In addition, this method of substrate protection avoids the execution of a deposition operation and an etching operation for deposition and removal of a protective layer 950.

Figure 13:
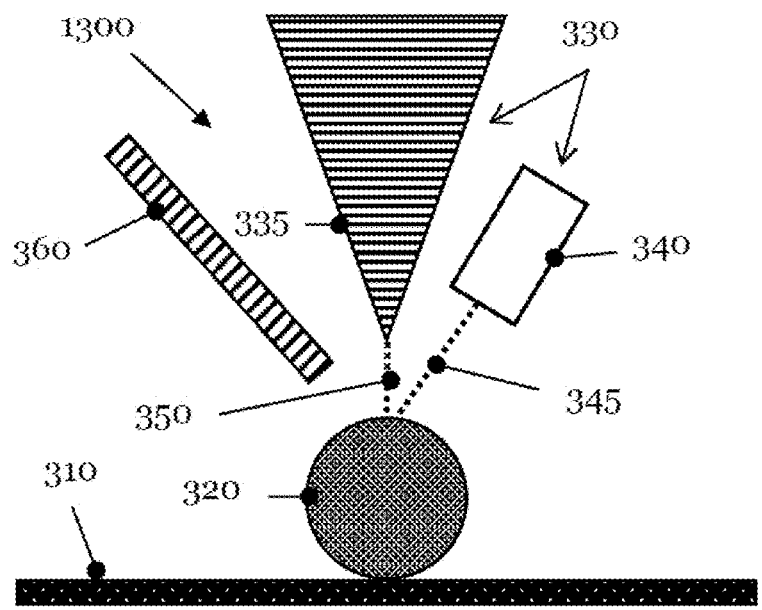
FIG. 13 shows a schematic of a second working example for removal of a particulate by execution of a spontaneous etching operation with a matched gas.
Figure 13:
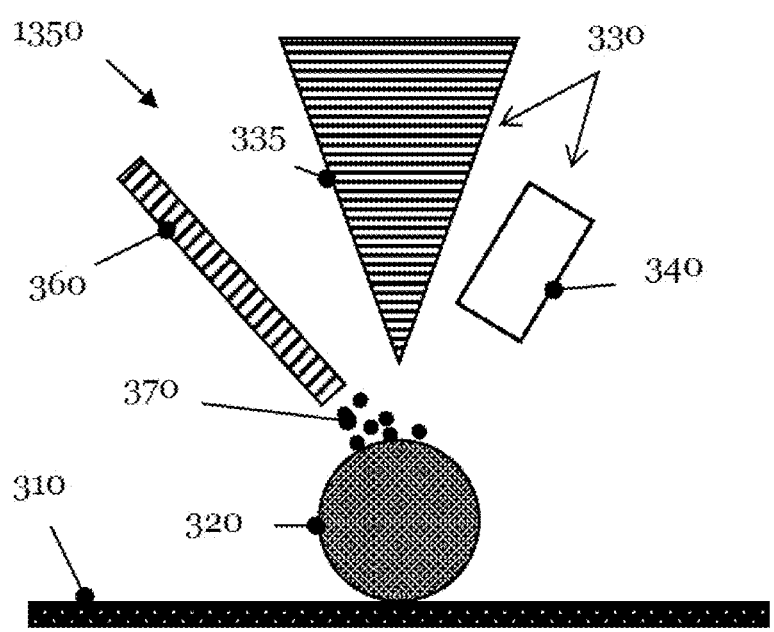

FIG. 13 presents a modification to the spontaneous etching operation illustrated in FIG. 8 for removal of a particulate 320. The upper part of the image 1300, similarly to the part of the image 800 in FIG. 8, depicts the analyzing of the material composition of the identified particulate 320. In addition to the analyzing of the chemical composition of the particulate 320, it is possible to determine the size of the particulate 320 with the aid of the analysis unit 330 and/or the microscopy system 390.

The etching rates of differently matched gas 370 for particulates 320 of a specific material composition can be measured in a separate operation and recorded in a database. On the basis of the composition determined and the parameter ascertained for an identified particulate 320, it is possible to calculate the required duration of action or the exposure dose to be provided for a matched gas 370. The spontaneous etching operation on the particulate 320 that has been executed by the matched gas 370 can then be executed without observation by the analysis unit 330 or the microscopy system 390. The spontaneous etching operation is illustrated schematically in the lower part of the image 1350 in FIG. 13.

Alternatively, it is also possible to stop an unobserved spontaneous etching operation after a given period of time, to image the remaining particulate residue by use of the analysis unit 330 and/or the microscopy system 390, to estimate a remaining etching time and then to continue the etching operation for the estimated time remaining. If required, the spontaneous etching operation can be stopped repeatedly in order to analyze the remaining particulate residue and then continued again.

Figure 14:
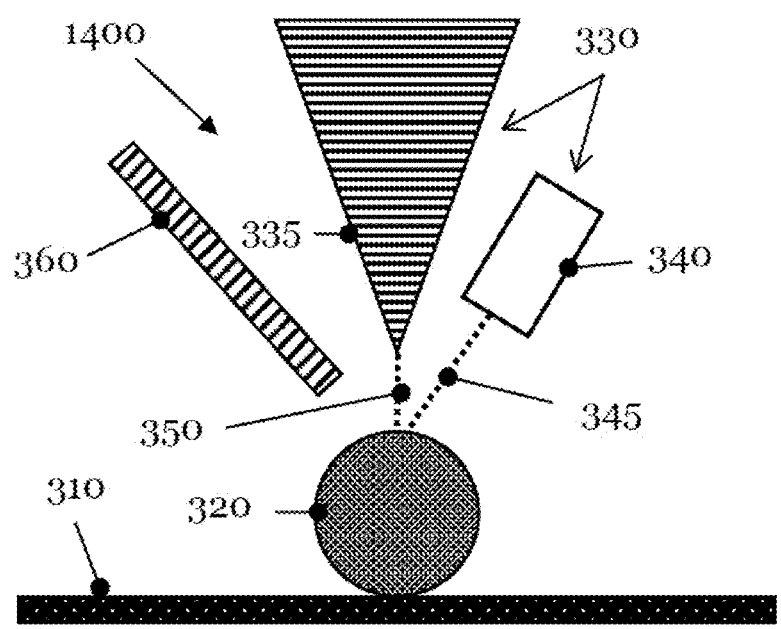
FIG. 14 illustrates a schematic of a working example of an EBIE operation with a matched gas for removal of a particulate from a substrate.
Figure 14:
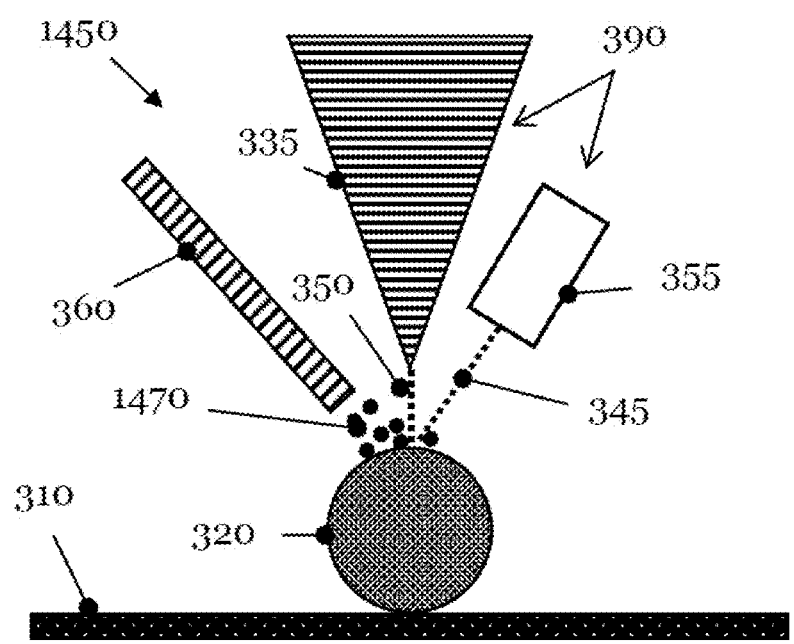

FIG. 14 presents, in schematic form, the removal of a particulate 320 with the aid of an EBIE operation. The upper part of the image 1400, similarly to FIG. 8, shows the analyzing of the chemical composition of the particulate 320 to be removed with the aid of the analysis unit 330. Based on the measurement data from the detector 340 of the analysis unit 330, the latter determines the essential constituents of the particulate 320. Then the analysis unit 330 ascertains a matched gas 1470 suitable for execution of an EBIE operation.

Similarly to the manner discussed in connection with FIG. 8, the analysis unit 330 can likewise analyze the composition of the substrate 310 surrounding the particulate 320 and can take account of its composition in determining a matched gas 1470. For example, the metal molybdenum can be etched with the etching gas $XeF_2$. The matched gas 1470 used for removal of a particulate 320 having silicon as its main constituent can be a mixture of $XeF_2$ and water vapor ($H_2O$). This matched gas 1470 can also remove a ruthenium-comprising particulate 320. Particulates 320 having organic materials as their main constituents can likewise be etched with a matched gas 1470 comprising $XeF_2$ and $H_2O$. Particulates 320 comprising tin (Sn) as their main constituent can be removed from the substrate 310 in an EBIE operation using a matched gas 1470 comprising ammonia ($NH_3$), hydrogen ($H_2$), nitrosyl chloride (NOCl), ammonium carbamate ($H_2NCOONH_4$) and/or ammonium carbonate (($NH_4$)$_2CO_3$).

If required, a passivation gas that prevents attack on the substrate 310 by the EBIE operation can be added to the matched gas 1470. It is additionally possible, as elucidated in FIG. 9, to apply a locally limited protective layer 950 around the particulate 320 to be removed (not illustrated in FIG. 14). Furthermore, it is possible to position one or more micromanipulators 620, 1120 for protection of the substrate 310 in the vicinity thereof during the etching of a particulate 320 to be removed from the substrate 310. However, these protective measures are typically unnecessary since an EBIE operation is concentrated exclusively in the region of the point of incidence of the particle beam 350 and thus has good controllability in lateral direction.

The lower part of the image 1450 in FIG. 14 shows the execution of the EBIE operation with the matched gas 1470 which is locally induced by the focused electron beam 350. The induced etching operation can be stopped after a particular period of time in order to examine the remaining particulate residue with the aid of the analysis unit 330 and/or the microscopy system 390. The image data for the remaining particulate residue are used to determine a remaining etching time for the particulate residue. If required, the stopping of the etching operation for analysis of the etching outcome can be repeated several times.

In an alternative embodiment (not depicted in FIG. 14), the electron beam 350 from the analysis unit 330 can be used to execute an EBIE operation, and a microscopy system 390 can be used to observe the progress of the etching operation.

In a further embodiment, the analysis step for the particulate 320 to be removed which is shown in the upper part of the image 1450 in FIG. 14 can be omitted. Instead, the particulate 320 can be removed from the substrate 310 in an EBIE operation with the aid of a standard etching gas, for instance $XeF_2$, or nitrosyl chloride (NOCl). If, however, in a subsequent image of the particulate 320 or of the particulate residue, it is found that the standard etching operation was unsuccessful or not completely successful, the particulate 320 or a particulate residue can be analyzed with regard to its chemical composition, a matched gas 1470 can be ascertained, and a particulate-specific etching operation can be executed.

If a particulate etching operation, in spite of the protective measures described above, has affected the substrate 310 as well, it is possible to execute a reconstruction operation downstream of the etching operation. For this purpose, the gas injection system 360 provides a reconstruction gas in the damaged area. The reconstruction gas used can, for example, be a metal carbonyl, especially chromium hexacarbonyl ($Cr(CO)_6$), alone or in combination with nitrogen dioxide ($NO_2$), and/or TEOS, again alone or in combination with nitrogen dioxide ($NO_2$). This can be stored in the seventh reservoir vessel 450 of the apparatus 400. The reconstruction gas is excited locally with the aid of the particle beam 350 from the analysis unit 330, which thus initiates a local EBID (electron beam-induced deposition) operation. The analysis unit 330 and/or the microscopy system 390 can be used to monitor the reconstruction operation on the substrate 310.

Figure 15:
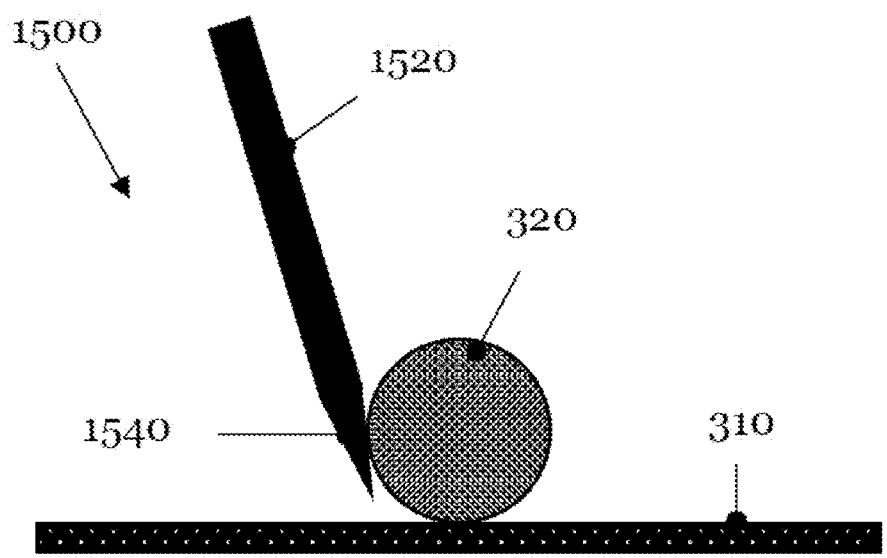
FIG. 15 presents a schematic of a working example for removal of a metal-containing particulate by alloy formation with a micromanipulator.
Figure 15:
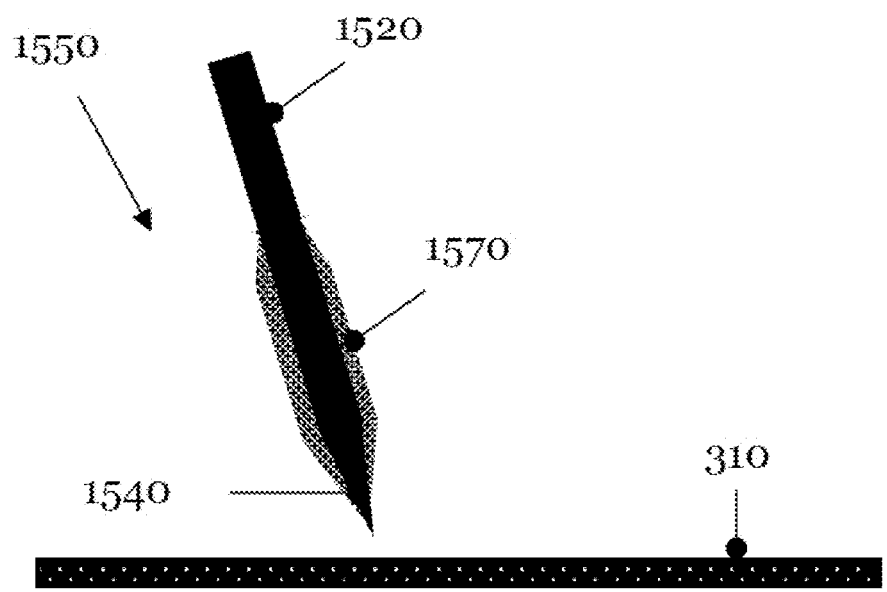

FIG. 15 schematically illustrates a further working example of the removal of a particulate 320 from the substrate 310. This particulate removal operation can be executed especially when the particulate 320 has a low melting point and can form a metal alloy with the micromanipulator 1520. The micromanipulator 1520 can be one of the micromanipulators 520, 620, 720 of the micromanipulator units 510, 610, 710. If, for example, the micromanipulator 1520 comprises bismuth or a bismuth coating, a particulate 320 having tin (Sn) as its main constituent can be dissolved by the micromanipulator 1520. To trigger this operation, it is necessary to heat the particulate 320 to at least its melting point.

The upper part of the image 1550 in FIG. 15 illustrates that the micromanipulator 1520 is brought into contact with the particulate 320 to be removed. The micromanipulator 1520 can be heated by use of an ohmic resistance implemented in the micromanipulator 1520 and application of an electrical voltage to the ohmic resistance. In order to accelerate the particulate removal operation, the micromanipulator 1520 can be warmed or heated even before coming into contact with the particulate 320. Heat transfer from the tip 1510 of the micromanipulator 1520 to the particulate 320 heats the latter up to its melting point. If the melting temperature of the particulate 320 is attained, this dissolves in the micromanipulator 1520. This operation is depicted schematically in the lower part of the image 1550 in FIG. 15. The particulate 320 has been dissolved by the micromanipulator 1520 and forms a corresponding metal alloy 1570 with the micromanipulator 1520.

In an alternative heating operation, the particulate 320 and the micromanipulator 1520 can be heated with the aid of a particle beam 350 from the analysis unit 330 and/or by a photon beam from the microscopy system 390. A combination of electrical heating by use of an ohmic resistance and heating with the aid of a particle beam 350 is of course likewise possible.

In a further embodiment (not illustrated in FIG. 15), the micromanipulator 1520 can include a carbon nanotube (CNT) or a multiwall carbon nanotube (MWCNT). CNTs and MWCNTs can be electrically soldered and hence have an adhesive effect on, or are wetted by, metals. CNTs and MWCNTs, especially in the heated state, can take up particulates 320 having a metal as their main constituent.

A further way of removing electrically conductive particulates 320 from a substrate 310 is the dissolution of the particulate 320 with the aid of electromigration (not illustrated in FIG. 15). For this purpose, it is necessary to contact the particulate 320 with an electrically conductive micromanipulator 1520. As a further prerequisite for execution of this mode of particulate removal, an electrically conductive substrate 310 is required, such that a flow of current from the substrate 310 through the particulate 320 into the micromanipulator 1520 can be built up. For building of a closed circuit through the particulate 320, the sample stage 402 and the micromanipulator unit that bears the micromanipulator 1520 can have an electrical terminal for a voltage source. The electrical potential of the sample stage 402 is transmitted to the electrically conductive particulate 320 by means of an electrical connecting means. The electrical terminals of a voltage source, which can be part of the apparatus 300, 400, are connected to the connecting use of the sample stage 402 and of the micromanipulator unit and of the securing section of the micromanipulator 1520.

Electromigration results from the transfer of momentum from moving conduction electrons to the metal ions in the crystal lattice. In order to dissolve an electrically conductive particulate 320 by transport of metal ions thereof to the micromanipulator 1520, it is favorable to guide a DC current through the particulate 320. It is also necessary to connect the positive pole of the circuit to the micromanipulator 1520. As a result, the metal ions of the particulate 320 move in the direction of the micromanipulator 1520. Since there is a rise in electromigration with increasing current density through the particulate 320, it is advantageous to select a maximum current density through the particulate 320 to be removed.

It is additionally favorable to assist the operation of electromigration in the particulate 320 by heating the particulate 320. Heating can be effected firstly by heating of the micromanipulator 1520 described above, and by heat transfer to the particulate 320. It is also possible to heat the particulate 320 by irradiating with the particle beam 350 from the analysis unit 330. It is of course also possible to heat the particulate 320 to be removed by electromigration by use of a combination of heat transfer from the micromanipulator 1520 and irradiation with the particle beam 350.

Figure 16:
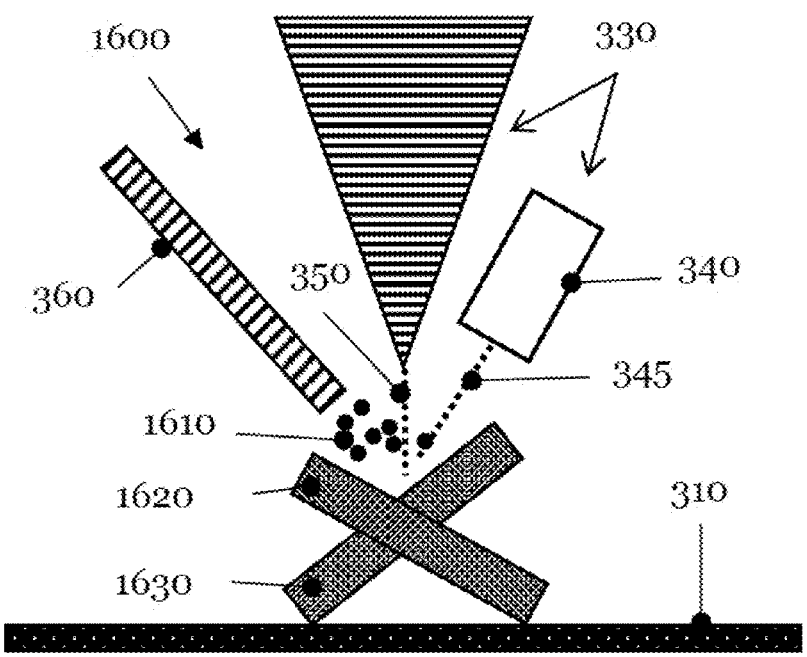
FIG. 16 shows a schematic of the stabilizing of an unstable particulate by deposition of material onto the unstable particulate, such that the stabilized particulate can be lifted off the substrate as a whole with the aid of a micromanipulator.

FIG. 16 presents the removal of a particulate 320 comprising, in the example shown, two parts 1620 and 1630 that are bound only loosely. The unstable particulate 320 is to be removed from the substrate 310 by lifting with a micromanipulator 1120. Without prior stabilization of the unstable particulate 320, there is the risk that the unstable particulate 320 will fall apart into two or more of its constituents 1620, 1630 when lifted with a micromanipulator 1120. The identifying of the two or more constituents 1620, 1630 and the removing of the individual fragments 1620, 1630 would distinctly increase the complexity of the particulate removal compared to the lifting of the particulate 320 as a whole from the substrate 310.

In order to avoid breakup of the unstable particulate 320 on movement thereof with the aid of a micromanipulator 1120, the unstable particulate 320 is stabilized in a first step by deposition of material, especially onto the region connecting the parts of the particulate 1620, 1630. For stabilization of the unstable particulate 320, a deposition gas 1610 stored in one of the two reservoir vessels 430 or 435 of the apparatus 400 is provided by the gas injection system 360 in the region of connection of the unstable particulate 320. The deposition gas 1610 can comprise a metal carbonyl, for example molybdenum hexacarbonyl ($Mo(CO)_6$) and/or tungsten hexacarbonyl ($W(CO)_6$). For stabilization of the unstable particulate 320, it is alternatively possible to use a carbon-rich hydrocarbon compound, for instance an unsaturated aromatic hydrocarbon, especially styrene.

The particle beam 350 from the analysis unit 330 initiates, on the basis of the deposition gas 1610, a local EBID operation that deposits material onto the unstable particulate 320, preferably onto the region connecting the two particulate constituents 1620 and 1630. The deposition operation is illustrated schematically in the upper part of the image 1600 in FIG. 16. The depositing of material onto the unstable particulate 320 can be observed with the aid of the microscopy system 390. Alternatively, the deposition operation can be stopped at periodic intervals and the analysis unit 330 can be used to image the unstable particulate 320.

The lower part of the image 1650 in FIG. 16 schematically presents the stabilized particulate 1670 that has been stabilized by the material 1660 deposited in the connection region. The stabilized particulate 1670 is removed as a whole from the substrate 310 in the second step by lifting with the aid of the micromanipulator 1120.

In the example illustrated in FIG. 16, the unstable particulate 320 comprises two constituents 1620 and 1630. However, it is also possible that an unstable particulate 320 has three or more constituents that are bonded to one another only loosely (not depicted in FIG. 16). Moreover, the stabilization operation elucidated above in the context of the upper part of the image 1600 can be used to bond an agglomerate of particulate portions or particulate fragments to give a single particulate that can be more easily handled and can be removed as a whole in a controlled manner from the substrate 310 by lifting with a micromanipulator 1120 (not shown in FIG. 16).

Figure 17:
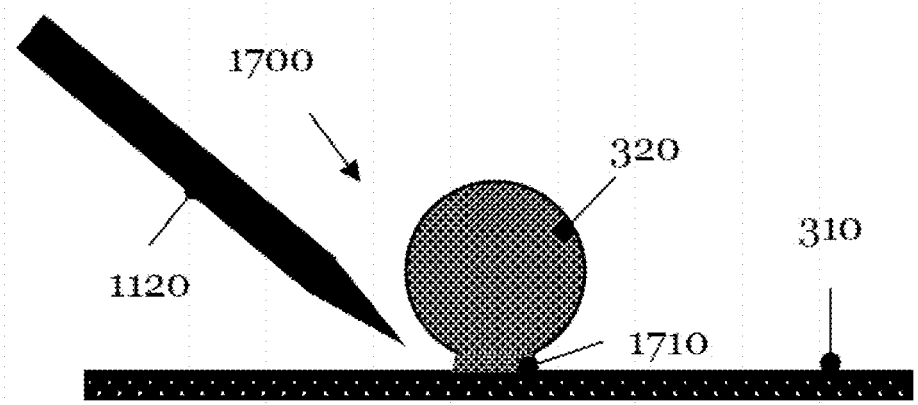
FIG. 17 shows a schematic of the approach of a micromanipulator to a particulate that has been bonded to the substrate by use of a particulate base.
Figure 18:
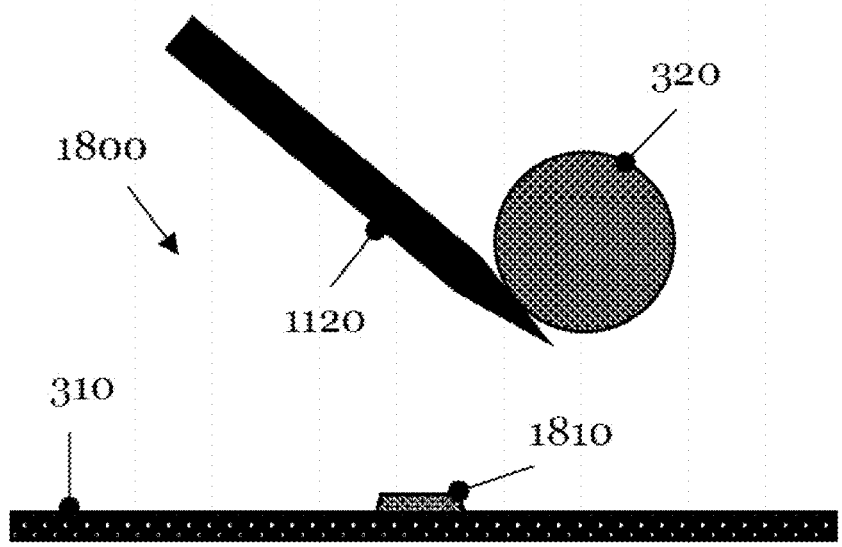
FIG. 18 illustrates a schematic of the lifting of the particulate from the substrate, wherein the base of the particulate remains as a particulate residue on the substrate.
Figure 19:
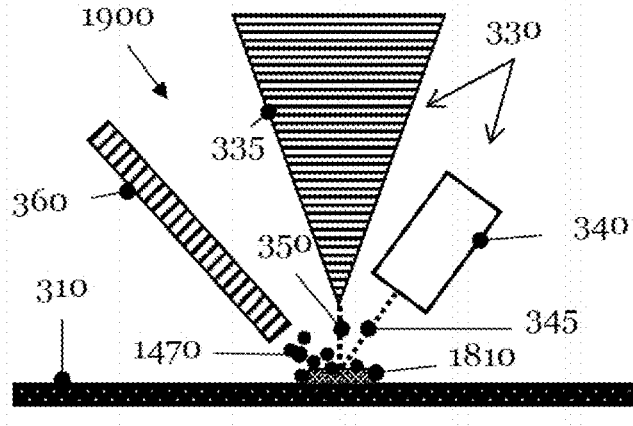
FIG. 19 shows a schematic of the removal of the particulate residue by execution of an EBIE operation with the aid of a matched gas.

FIGS. 17 to 19 illustrate a further two-stage operation for removal of a particulate 320 from a substrate 310. As depicted by way of example in FIG. 17, the particulate 320 is connected to or fused to the substrate 310 by a kind of particulate base 1710. As illustrated in FIG. 17, a micromanipulator 1120 is brought toward the particulate 320. In the second step, depicted in FIG. 18, the particulate 320 is lifted or raised away from substrate 310 by mechanical contact with the micromanipulator 1120. In this operation, not the entire particulate 320 is separated from the substrate 310. Instead, the bond between the particulate base 1710 and the particulate 320 breaks, and the particulate base 1710 remains as a particulate residue 1810 on the surface of the substrate 310.

FIG. 19 presents the removal of the particulate residue 1810 from the substrate 310 by execution of an EBIE operation with the aid of a gas 1470 matched to the particulate 320 or the particulate residue 1810. For determination of the matched gas 1470, it is either possible to analyze the chemical composition of the particulate 320 removed and/or to use the analysis unit 330 in order to ascertain the material composition of the particulate residue 1810 (not depicted in FIG. 19). If required, the modifications discussed above in the context of FIGS. 8 to 14 can also be used for removal of the particulate residue 1810.

Figure 20:
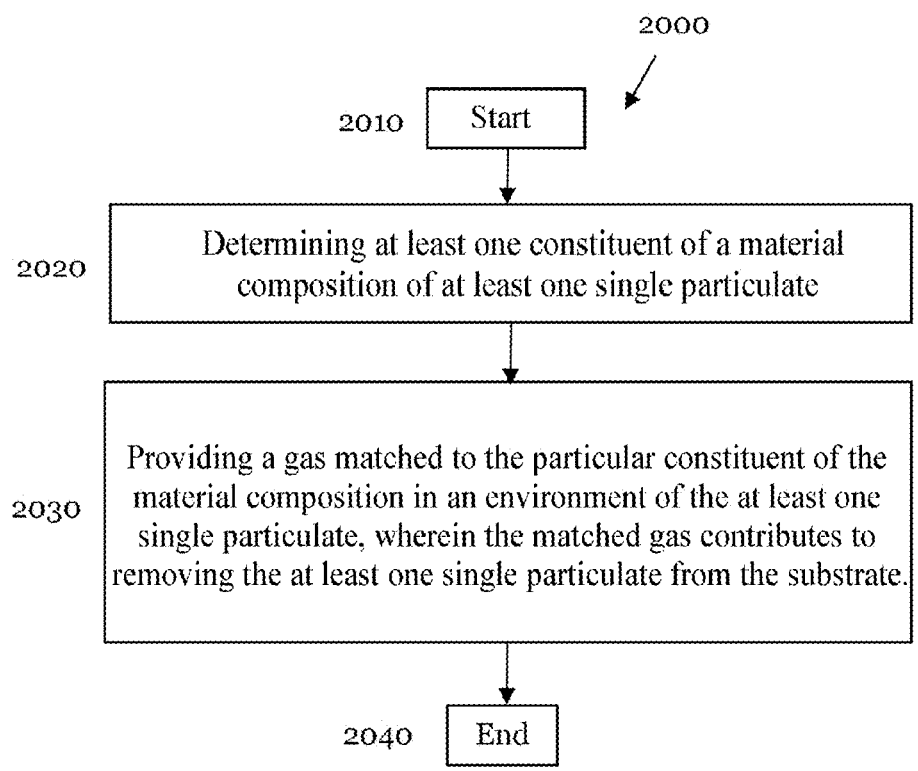
FIG. 20 depicts a flow diagram of the method of removing at least a single particulate on a substrate, especially an optical element for the EUV wavelength range.

Finally, the flow diagram 2000 in FIG. 20 represents essential steps of an example of the method of removing at least a single particulate 320 from a substrate 310. The substrate 310 can comprise an optical element for the EUV wavelength range and/or an EUV mask.

The method begins in step 2010. In step 2020, at least one constituent of a material composition of the at least one particulate 320 is determined. For this purpose, it is possible to use the analysis unit 330.

In step 2030, a gas 370, 1470 matched to the particular constituent of the material composition is provided in an environment of the at least one single particulate 320, where the matched gas 370, 1470 contributes to removal of the at least a single particulate 320 from the substrate 310. The matched gas 370, 1470 can be provided by the gas injection system 360. The method then ends with step 2040.

The description above related to the removal of particulates from photomasks (or other types of substrates) can be applied to many types of particulates, in which some types of particulates can be removed from a photomask with difficulty with the aid of a cleaning operation only. Other implementations for removal of one or more particulates on a substrate can involve a process that includes steps different from those shown in FIG. 20. For example, the process can include more or fewer steps than those shown in FIG. 20, or can include steps modified from the steps shown in FIG. 20.

In some implementations, the computer system 420 (FIGS. 4A, 4B) or other data processing modules can include one or more data processors for processing data, one or more storage devices for storing data, such as one or more databases, and/or one or more computer programs including instructions that when executed by the evaluation device or computer system causes the evaluation device or computer system to carry out the computations or processes described above. In some implementations, the evaluation device or computer system can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the computer system 420 can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the data processing (e.g., applying a machine learning model to predict at least one constituent of the material composition of at least one particulate) described above can be implemented using software for execution on one or more mobile computing devices, one or more local computing devices, one or more remote computing devices, and/or one or more cloud computing servers. For instance, the software forms procedures in one or more computer programs that execute on one or more programmed or programmable computer systems, either in the mobile computing devices, local computing devices, or remote computing systems (which can be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software can be provided on a medium, such as a CD-ROM, DVD-ROM, Blu-ray disc, hard drive, or flash drive, readable by a general or special purpose programmable computer or delivered (encoded in a propagated signal) over a network to the computer where it is executed. The functions can be performed on a special purpose computer, or using special-purpose hardware, such as coprocessors. The software can be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system can also be considered to be implemented as a computer-readable storage medium, configured with a computer program, where the storage medium so configured causes a computer system to operate in a specific and predefined manner to perform the functions described herein.

While this specification contains many implementation details, these should not be construed as limitations on the scope of the invention or of what can be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments. Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In addition, the actions recited in the claims can be performed in a different order and still achieve desirable results

What is claimed is:

1. A method of removing at least one particulate from a substrate, the method comprising:
   a. providing a plurality of reservoir vessels that store a plurality of gases, in which each reservoir vessel stores a respective gas;
   b. determining, from among the plurality of gases, a gas matched to at least one determined constituent of a material composition of the at least one particulate; and
   c. using a material database for determining the gas matched to the determined at least one constituent of the material composition of the at least one particulate;
   d. providing the gas in an environment of the at least one particulate, wherein the gas contributes to removing the at least one particulate from the substrate.

2. The method of claim 1, comprising:
   a. receiving first information about a determined constituent of a material composition of a first particulate;
   b. determining a first gas from the plurality of gases, the first gas matched to the determined constituent of the material composition of the first particulate;
   c. providing the first gas in an environment of the first particulate, wherein the first gas contributes to removing the first particulate from the substrate;
   d. receiving second information about a determined constituent of a material composition of a second particulate, wherein the constituent of the material composition of the second particulate is different from the constituent of the material composition of the first particulate;
   e. determining a second gas from the plurality of gases, the second gas matched to the determined material composition of the second particulate, wherein the second gas is different from the first gas; and
   f. providing the second gas in an environment of the second particulate, wherein the second gas contributes to removing the second particulate from the substrate.

3. The method of claim 1, comprising:
   a. irradiating the at least one particulate with a particle beam;
   b. detecting secondary electrons reflected by the at least one particulate;
   c. transmitting information about the detected secondary electrons to a remote computing device; and
   d. receiving, from the remote computing device, information about a determined constituent of a material composition of the at least one particulate.

4. The method of claim 1, wherein determining the gas matched to the at least one constituent of the material composition is at least in part based on information of an apparatus in assisting in removing the at least one particulate.

5. The method of claim 1, wherein the matched gas spontaneously etches the at least one particulate.

6. The method of claim 1, wherein the at least one particulate comprises at least one of: a pure metal, a metal alloy, an oxide, a halide, a nitride, a sulfide, a phosphide, a salt, or an organic compound.

7. The method of claim 1, wherein the at least one particulate comprises at least one of: tin (Sn) and the matched gas comprises at least one element of the group of: a hydrogen compound, hydrogen (H2), a halogen compound, or nitrosyl chloride; molybdenum and the matched gas comprises xenon difluoride (XeF2); silicon (Si) and/or ruthenium (Ru) and the matched gas comprises xenon difluoride (XeF2) and water vapor (H2O); or one or more organic materials and water and the matched gas comprises xenon difluoride (XeF2).

8. The method of claim 1, wherein the at least one particulate comprises an element from the group of: a particulate which is unstable with respect to the removal from the substrate, a particulate having two or more particulate fragments, or a particulate comprising a particulate agglomerate.

9. The method of claim 1, wherein the at least one particulate has a diameter within a range of 1 nm to 100 μm.

10. A non-transitory computer-readable medium comprising a computer program product having instructions which when executed by a computer system cause the computer system to perform the steps of claim 1.

11. The non-transitory computer-readable medium of claim 10, further comprising instructions for causing the computer system to perform
   a. receiving first information about a determined constituent of a material composition of a first particulate;
   b. determining a first gas from the plurality of gases, the first gas matched to the determined constituent of the material composition of the first particulate;
   c. providing the first gas in an environment of the first particulate, wherein the first gas contributes to removing the first particulate from the substrate;
   d. receiving second information about a determined constituent of a material composition of a second particulate, wherein the constituent of the material composition of the second particulate is different from the constituent of the material composition of the first particulate;
   e. determining a second gas from the plurality of gases, the second gas matched to the determined material composition of the second particulate, wherein the second gas is different from the first gas; and
   f. providing the second gas in an environment of the second particulate, wherein the second gas contributes to removing the second particulate from the substrate.

12. A method for assisting in removing at least one particulate from a substrate, the method comprising the steps of:
  a. receiving first information about detected secondary electrons that are produced by irradiating the at least one particulate with a particle beam;
  b. determining at least one constituent of a material composition of the at least one particulate, including applying at least one of a machine learning model or a predictive filter to predict the constituent of the material composition of the at least one particulate based on the first information about detected secondary electrons; and
  c. providing information associated with the at least one determined constituent for determining a gas matched to the at least one determined constituent that contributes to removing the at least one particulate from the substrate.

13. The method of claim 12, comprising:
  a. determining a first constituent of a material composition of a first particulate;
  b. forwarding first information associated with the first constituent to an apparatus for removing the first particulate from the substrate, wherein the first information is useful for determining a first gas matched to the first constituent that contributes to removing the first particulate from the substrate;
  c. determining a second constituent of a material composition of a second particulate; and
  d. forwarding second information associated with the second constituent to the apparatus for removing the second particulate from the substrate, wherein the second information is useful for determining a second gas matched to the second constituent that contributes to removing the second particulate from the substrate.

14. The method of claim 12, wherein the first information about the detected secondary electrons comprises an energy spectrum of the secondary electrons.

15. The method of claim 12, comprising:
  a. receiving first information about detected secondary electrons that are produced by irradiating a first particulate with the particle beam or a further particle beam;
  b. applying at least one of the machine learning model or the predictive filter to predict a first constituent of the material composition of the first particulate based on the first information about detected secondary electrons to generate second information associated with the first constituent;
  c. transmitting the second information to an apparatus for removing the first particulate from the substrate;
  d. receiving third information about detected secondary electrons that are produced by irradiating a second particulate with the particle beam or the further particle beam;
  e. applying at least one of the machine learning model or the predictive filter to predict a second constituent of the material composition of the second particulate based on the third information about detected secondary electrons to generate fourth information associated with the second constituent; and
  f. transmitting the fourth information to the apparatus for removing the second particulate from the substrate.

16. The method of claim 12, further comprising determining the gas matched to the at least one determined constituent of the material composition of the at least one particulate.

17. A method for assisting in removing at least one particulate from a substrate, the method comprising the steps of:
  a. receiving first information about detected secondary electrons that are produced by irradiating the at least one particulate with a particle beam;
  b. determining at least one constituent of a material composition of the at least one particulate, including applying a machine learning model, applying a predictive filter, and/or using a material database to predict the constituent of the material composition of the at least one particulate based on the first information about detected secondary electrons;
  c. providing information associated with the at least one determined constituent for determining a gas matched to the at least one determined constituent that contributes to removing the at least one particulate from the substrate;
  d. receiving first information about detected secondary electrons that are produced by irradiating a first particulate with the particle beam or a further particle beam;
  e. applying at least one of the machine learning model or the predictive filter to predict a first constituent of the material composition of the first particulate based on the first information about detected secondary electrons to generate second information associated with the first constituent;
  f. transmitting the second information to an apparatus for removing the first particulate from the substrate;
  g. receiving third information about detected secondary electrons that are produced by irradiating a second particulate with the particle beam or the further particle beam;
  h. applying at least one of the machine learning model or the predictive filter to predict a second constituent of the material composition of the second particulate based on the third information about detected secondary electrons to generate fourth information associated with the second constituent; and
  i. transmitting the fourth information to the apparatus for removing the second particulate from the substrate.

* * * * *